(12) United States Patent
Hagiwara et al.

(10) Patent No.: US 9,571,772 B2
(45) Date of Patent: Feb. 14, 2017

(54) SOLID-STATE IMAGING DEVICE, DRIVING METHOD AND ELECTRONIC APPARATUS WITH ELECTRIC CHARGE TRANSFER USING AN INTERMEDIATE POTENTIAL

(71) Applicant: Sony Semiconductor Solutions Corporation, Kanagawa (JP)

(72) Inventors: Hiroki Hagiwara, Kanagawa (JP); Takahiro Toya, Kanagawa (JP); Shinya Numadu, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 288 days.

(21) Appl. No.: 14/332,543

(22) Filed: Jul. 16, 2014

(65) Prior Publication Data

US 2015/0028189 A1     Jan. 29, 2015

(30) Foreign Application Priority Data

Jul. 23, 2013    (JP) ................................. 2013-152895

(51) Int. Cl.
    *H04N 5/378*      (2011.01)
    *H01L 27/146*      (2006.01)
    *H04N 5/3745*      (2011.01)

(52) U.S. Cl.
CPC ........ *H04N 5/378* (2013.01); *H01L 27/14614* (2013.01); *H01L 27/14643* (2013.01); *H04N 5/37452* (2013.01)

(58) Field of Classification Search
CPC .................... H01L 27/14614; H01L 27/14643; H01L 27/14609; H01L 27/14612; H01L 27/146; H01L 27/14887; H04N 5/378; H04N 5/37452; H04N 5/3591; H04N 5/3745; H04N 5/37455; H04N 5/374; H04N 5/3592; H04N 5/3595; H04N 5/353; H04N 5/3532

(Continued)

(56) References Cited

U.S. PATENT DOCUMENTS 7,271,835 B2 *   9/2007   Iizuka ............... H01L 27/14609
                                                                  257/E27.132
7,952,121 B2 *   5/2011   Arimoto ........... H01L 27/14603
                                                                    257/230

(Continued)

FOREIGN PATENT DOCUMENTS

JP      2009-054870 A      3/2009
JP      2011-216672 A     10/2011

(Continued)

OTHER PUBLICATIONS

Japanese Office Action issued Dec. 1, 2016 for corresponding Japanese Application No. 2013-152895.

*Primary Examiner* — Que T Le
*Assistant Examiner* — Jennifer Bennett
(74) *Attorney, Agent, or Firm* — Michael Best & Friedrich LLP

(57) ABSTRACT

A solid-state imaging device includes a pixel and a floating diffusion. The pixel includes a photoelectric conversion element that converts incident light into and electric charge, a first transfer gate that includes a plurality of electrodes and transfers the electric charge from the photoelectric conversion element, a charge holding region that holds the electric charge transferred from the photoelectric conversion element by the first transfer gate, each of the plurality of electrodes of the first transfer gate corresponding to a sub-region of the charge holding region, and a second transfer gate that transfers the electric charge from the charge holding region. The floating diffusion region holds (Continued)

the electric charge transferred from the charge holding region by the second transfer gate.

17 Claims, 19 Drawing Sheets

(58) Field of Classification Search
USPC ....... 250/208.1, 214 R, 206, 214.1; 348/241,
348/248, 296, 297, 298, 299, 300, 301,
348/302, 308, 294; 257/257, 258,
257/290–292, 225, 229, 230
See application file for complete search history.

(56) References Cited

U.S. PATENT DOCUMENTS

| | | | | |
|---|---|---|---|---|
| 8,026,966 | B2* | 9/2011 | Altice | H04N 5/35527 |
| | | | | 348/294 |
| 2005/0127415 | A1* | 6/2005 | Yuzurihara | H01L 27/14603 |
| | | | | 257/292 |
| 2008/0099807 | A1* | 5/2008 | Kim | H01L 27/14603 |
| | | | | 257/292 |
| 2011/0241079 | A1* | 10/2011 | Oike | H01L 27/14616 |
| | | | | 257/225 |
| 2012/0153125 | A1* | 6/2012 | Oike | H01L 27/14612 |
| | | | | 250/208.1 |

FOREIGN PATENT DOCUMENTS

| | | |
|---|---|---|
| JP | 2011-217315 | 10/2011 |
| JP | 2012-129797 | 7/2012 |

* cited by examiner

SOLID-STATE IMAGING DEVICE, DRIVING METHOD AND ELECTRONIC APPARATUS WITH ELECTRIC CHARGE TRANSFER USING AN INTERMEDIATE POTENTIAL

CROSS REFERENCE TO RELATED APPLICATIONS

This application claims the benefit of Japanese Priority Patent Application JP 2013-152895 filed Jul. 23, 2013, the entire contents of which are incorporated herein by reference.

BACKGROUND

The present technology relates to a solid-state imaging device, a driving method thereof and an electronic apparatus, and, particularly, to a solid-state imaging device which allows transfer capability of an electric charge to be ensured without sacrificing sensitivity and a held electric charge quantity, a driving method thereof and an electronic apparatus.

In the related art, a solid-state imaging device such as a Complementary Metal Oxide Semiconductor (CMOS) image sensor is widely used for a digital still camera, a digital video camera and the like.

Further, as a system of an electronic shutter of the CMOS image sensor, a global shutter system is proposed (see Japanese Unexamined patent Application Publication No. 2012-129797 and Japanese Unexamined patent Application Publication No. 2011-217315). The global shutter system performs operation that starts exposure for all pixels effective for imaging at the same time and completes the exposure at the same time. Thus, equipping of a memory section for temporarily holding an optical electric charge accumulated by a photodiode while waiting for order of reading after the exposure is completed is necessary.

That is, as illustrated in a cross-sectional view of unit pixel of FIG. 1, a pixel structure is used in which a pixel structure is used in which a memory section (MEM) 23 is provided inside the unit pixel and electric charge accumulated in a photodiode (PD) 21 is transferred concurrently for all pixels to the memory section 23 by a first transfer gate (TRX) 22, and the electric charge is held until a reading operation is performed for each row.

Here, a driving method of the unit pixel of FIG. 1 is described with reference to FIGS. 2 and 3. However, in a potential diagram of FIG. 3, states of a period t1 to period t5 correspond respectively to a period t1 to a period t5 in a timing chart of FIG. 2.

In the period t1, if the electric charge of the photodiode 21 and the memory section 23 is discharged, the electric charge obtained from light from an object is newly accumulated in the photodiode 21 concurrently for all pixels. Further, in the period t2, if a voltage level of a drive signal applied to a gate electrode of the first transfer gate 22 becomes a VH level, the electric charge accumulated in the photodiode 21 is transferred to the memory section 23. Then, in the period t3, if the voltage level of the drive signal applied to the gate electrode of the first transfer gate 22 becomes a VL level, the electric charge is held in the memory section 23.

Thereafter, in the period t4, the voltage level of the drive signal applied to a gate electrode of a second transfer gate (TRG) 24 becomes the VH level, and the electric charge held in the memory section 23 is transferred to a Floating Diffusion (FD) region 25. Then, in the period t5, if the voltage level of the drive signal applied to the gate electrode of the second transfer gate 24 becomes the VL level, a voltage corresponding to the electric charge held in the floating diffusion region 25 is read as a signal level.

SUMMARY

However, in the unit pixel described above, in order to ensure the sensitivity as much as possible, it is preferable that an area of an opening be as large as possible and the opening do not have a shape of which a length of only one side is short but have a shape close to a square from the viewpoint of light condensing. An exemplary arrangement pattern of the unit pixels is illustrated in FIG. 4. Moreover, if a cross section of VI-VI is made in the first transfer gate (TRX) 22 as illustrated in FIG. 5, it becomes a cross-sectional view of FIG. 6.

As illustrated in FIG. 4, since the first transfer gate (TRX) 22 has a rectangular shape, an aspect ratio thereof is large. Here, if attention is paid to the transfer from the first transfer gate (TRX) 22 to the floating diffusion region (FD) 25, a length L in a transfer direction is increased, and thus the transfer is unlikely to be performed. In this case, in order to reliably perform the transfer, it is necessary to perform adjustment of potential so as to apply an electric field from the second transfer gate (TRG) 24 to the floating diffusion region (FD) 25. However, in order to realize the adjustment without changing a potential in the floating diffusion region (FD) 25, it is necessary to shallow the potential on an upstream of the transfer. At this time, an adverse effect that the electric charge quantity that may be held in the memory section 23 becomes small occurs.

Meanwhile, in Japanese Unexamined patent Application Publication No. 2011-217315, a structure is disclosed in which an electric charge transfer accumulation section has a plurality of stages and since the length of the transfer becomes short by using the structure, the transfer is easily performed. However, also in the structure, since the electric charge accumulation section decreases with the number of the stages, the electric charge quantity that may be held is reduced to that extent.

It is desirable to secure transfer capability of an electric charge without sacrificing sensitivity and a held electric charge quantity.

According to an exemplary illustration of the present technology, there is provided a solid-state imaging device including: a plurality of unit pixels, in which the unit pixel includes a photoelectric conversion element that generates electric charge depending on a light quantity of incident light and accumulates the electric charge on the inside thereof, a first transfer gate that transfers the electric charge accumulated in the photoelectric conversion element, an electric charge holding region that holds the electric charge transferred from the photoelectric conversion element by the first transfer gate, a second transfer gate that transfers the electric charge held in the electric charge holding region, and a floating diffusion region that holds the electric charge transferred from the electric charge holding region by the second transfer gate for reading as a signal, in which the electric charge holding region has regions of a plurality of stages for holding the electric charge, and in which an N-type region is formed between the regions of the plurality of stages.

In the exemplary illustration, the regions of the plurality of stages may be formed of one of a first region that is used for reading the electric charge accumulated in the photoelectric conversion element and a second region other than the first region.

In the exemplary illustration, in the first region, element separation between the photoelectric conversion element and the electric charge holding region may be performed by a gate bias using the first transfer gate, and in the second region, the element separation may be performed by an element separation structure different from that of the first region.

In the exemplary illustration, in the second region, the element separation may be performed by a p+ impurity diffusion region.

In the exemplary illustration, in the second region, the element separation may be performed by an oxide film region.

In the exemplary illustration, the regions of the plurality of stages may have a two-stage configuration.

In the exemplary illustration, the first transfer gate may be configured of a plurality of electrodes corresponding to the regions of the plurality of stages.

According to another exemplary illustration of the present technology, there is provided a driving method of a solid-state imaging device including: a plurality of unit pixels; and a driving controller that controls driving of the unit pixels, in which the unit pixel includes a photoelectric conversion element that generates electric charge depending on a light quantity of incident light and accumulates the electric charge on the inside thereof, a first transfer gate that transfers the electric charge accumulated in the photoelectric conversion element, an electric charge holding region that holds the electric charge transferred from the photoelectric conversion element by the first transfer gate, a second transfer gate that transfers the electric charge held in the electric charge holding region, and a floating diffusion region that holds the electric charge transferred from the electric charge holding region by the second transfer gate for reading as a signal, and in which the method includes: controlling driving of the first transfer gate configured of a plurality of electrodes corresponding to the regions of the plurality of stages which hold the electric charge in the electric charge holding region and has a region therebetween that becomes an N-type region by the driving controller for each electrode.

According to a still another exemplary illustration of the present technology, there is provided an electronic apparatus that is equipped with a solid-state imaging device, including: a plurality of unit pixels, in which the unit pixel includes a photoelectric conversion element that generates electric charge depending on a light quantity of incident light and accumulates the electric charge on the inside thereof, a first transfer gate that transfers the electric charge accumulated in the photoelectric conversion element, an electric charge holding region that holds the electric charge transferred from the photoelectric conversion element by the first transfer gate, a second transfer gate that transfers the electric charge held in the electric charge holding region, and a floating diffusion region that holds the electric charge transferred from the electric charge holding region by the second transfer gate for reading as a signal, in which the electric charge holding region has regions of a plurality of stages for holding the electric charge, and in which an N-type region is formed between the regions of the plurality of stages.

According to another exemplary illustration of the disclosed subject matter, a solid-state imaging device may comprise a pixel that includes: a photoelectric conversion element that converts incident light into and electric charge, a first transfer gate that includes a plurality of electrodes and transfers the electric charge from the photoelectric conversion element, a charge holding region that holds the electric charge transferred from the photoelectric conversion element by the first transfer gate, each of the plurality of electrodes of the first transfer gate corresponding to a sub-region of the charge holding region, and a second transfer gate that transfers the electric charge from the charge holding region. The solid-state imaging device may also comprise a floating diffusion region that holds the electric charge transferred from the charge holding region by the second transfer gate.

In addition, the sub-regions of the charge holding region may include a first sub-region that reads the electric charge directly from the photoelectric conversion element and a second sub-region different from the first sub-region.

In addition, the first sub-region may be electrically separated from the photoelectric conversion element by a gate bias of a corresponding electrode of the first transfer gate, and wherein the second sub-region stage may be electrically separated from the photoelectric conversion element by an element separation structure different from that of the first sub-region.

In addition, the second sub-region may be electrically separated from the photoelectric conversion element by a p+ impurity diffusion region.

In addition, the second sub-region may be electrically separated from the photoelectric conversion element by an oxide film region.

In addition, the first transfer gate, may include two electrodes.

The solid-state imaging device may further comprise a control circuit that is configured to cause the pixel to transfer the electric charge from the photoelectric conversion element to the floating diffusion region by, in order: supplying a high potential to each of the plurality of electrodes of the first transfer gate, thereby transferring the electric charge from the photoelectric conversion element to the charge holding region; switching the high potential to an intermediate potential in each of the electrodes of the first transfer gate; and opening the second transfer gate and, while the second transfer gate is open, sequentially supplying a low potential to the plurality of electrodes of the first transfer gate, thereby transferring the electric charge from the charge holding region to the floating diffusion region. The intermediate potential may have a value between the respective values of the high and low potentials.

In addition, at least one of the sub-regions of the charge holding region may be electrically separated from the photoelectric conversion element when the intermediate or low potentials are supplied to the corresponding electrode of the first transfer gate, and is electrically connected to the photoelectric conversion element when the high potential is supplied to the corresponding electrode of the first transfer gate.

The solid-state imaging device may further comprise a control circuit that is configured to cause the pixel to transfer the electric charge from the photoelectric conversion element to the floating diffusion region by, in order: supplying an ON potential to at least one of the plurality of electrodes of the first transfer gate, thereby transferring the electric charge from the photoelectric conversion element to the charge holding region; supplying an OFF potential to each of the plurality of electrodes of the first transfer gate, the OFF potential being a potential that prevents charge from flowing from the photoelectric conversion element to the charge holding region; and opening the second transfer gate and, while the second transfer gate is open, supplying one of the ON potential and an intermediate potential to a given electrode of the plurality of electrodes of the first transfer gate, and then supplying the OFF potential to the given electrode, thereby transferring the electric charge from the charge holding region to the floating diffusion region, wherein the intermediate potential has a value between the respective values of the ON and OFF potentials.

According to another exemplary illustration of the disclosure, a method of driving a solid-state imaging device that includes a photoelectric conversion element that converts incident light into and electric charge, a first transfer gate that includes a plurality of electrodes and transfers electric charge from the photoelectric conversion element, a charge holding region that holds the electric charge transferred from the photoelectric conversion element by the first transfer gate and that includes a plurality of sub-regions each corresponding to one of the electrodes of the first transfer gate, a second transfer gate that transfers the electric charge from the charge holding region, and a floating diffusion region that holds the electric charge transferred from the charge holding region by the second transfer gate, may include: transferring charge from the photoelectric conversion element to the charge holding region by applying signal pulses to the electrodes of the first transfer gate; and transferring charge from the charge holding region to the floating diffusion by applying signal pulses to at least one of the electrodes of the first transfer gate and to the second transfer gate.

The method may further include causing the pixel to transfer the electric charge from the photoelectric conversion element to the floating diffusion region by, in order: supplying a high potential to each of the plurality of electrodes of the first transfer gate, thereby transferring the electric charge from the photoelectric conversion element to the charge holding region; switching the high potential to an intermediate potential in each of the electrodes of the first transfer gate; opening the second transfer gate and, while the second transfer gate is open, sequentially supplying a low potential to the plurality of electrodes of the first transfer gate, thereby transferring the electric charge from the charge holding region to the floating diffusion region.

According to another exemplary illustration of the disclosure, an electronic apparatus may be equipped with the any of the exemplary solid-state imaging devices disclosed herein.

In the solid-state imaging device, the driving method thereof and the electronic apparatus of the exemplary illustrations of the present technology, the electric charge holding region is configured so as to have the regions of the plurality of stages for holding the electric charge, and the N-type region is formed between the regions of the plurality of stages.

According to the exemplary illustrations of the present technology, it is possible to secure the transfer capability of the electric charge without sacrificing sensitivity and the held electric charge quantity.

DETAILED DESCRIPTION OF EMBODIMENTS

Hereinafter, an embodiment of the present technology is described with reference to the drawings.

Configuration Example of Solid-State Imaging Device

Figure 1:
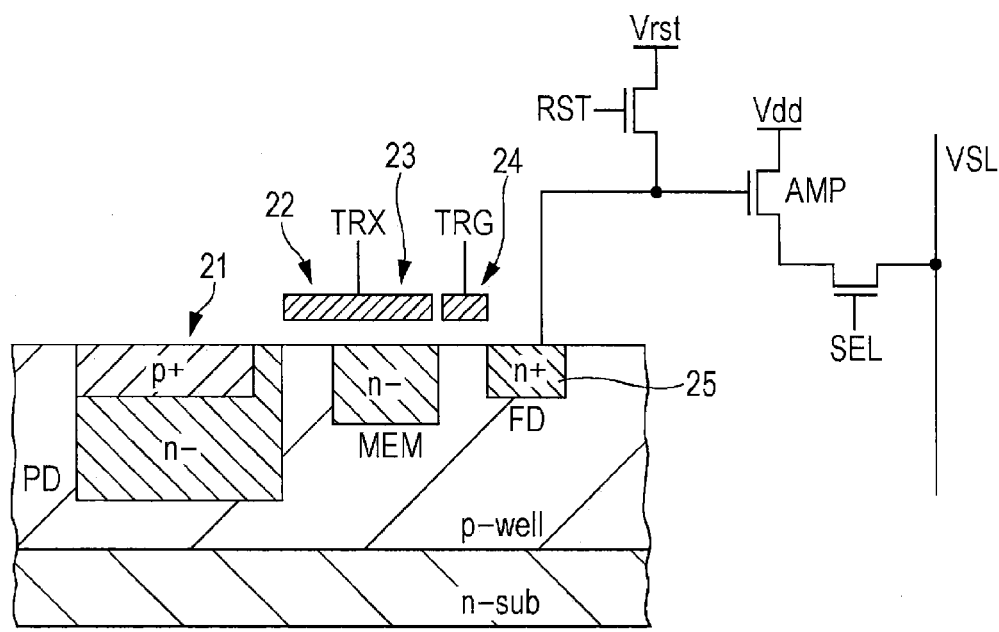
FIG. 1 is a cross-sectional view illustrating a configuration of a unit pixel of the related art.
Figure 2:
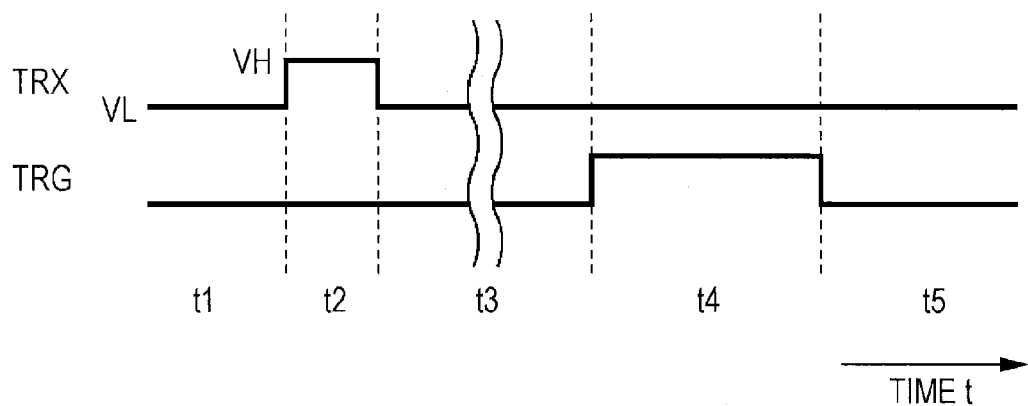
FIG. 2 is a timing chart describing a driving method of the unit pixel of the related art.
Figure 3:
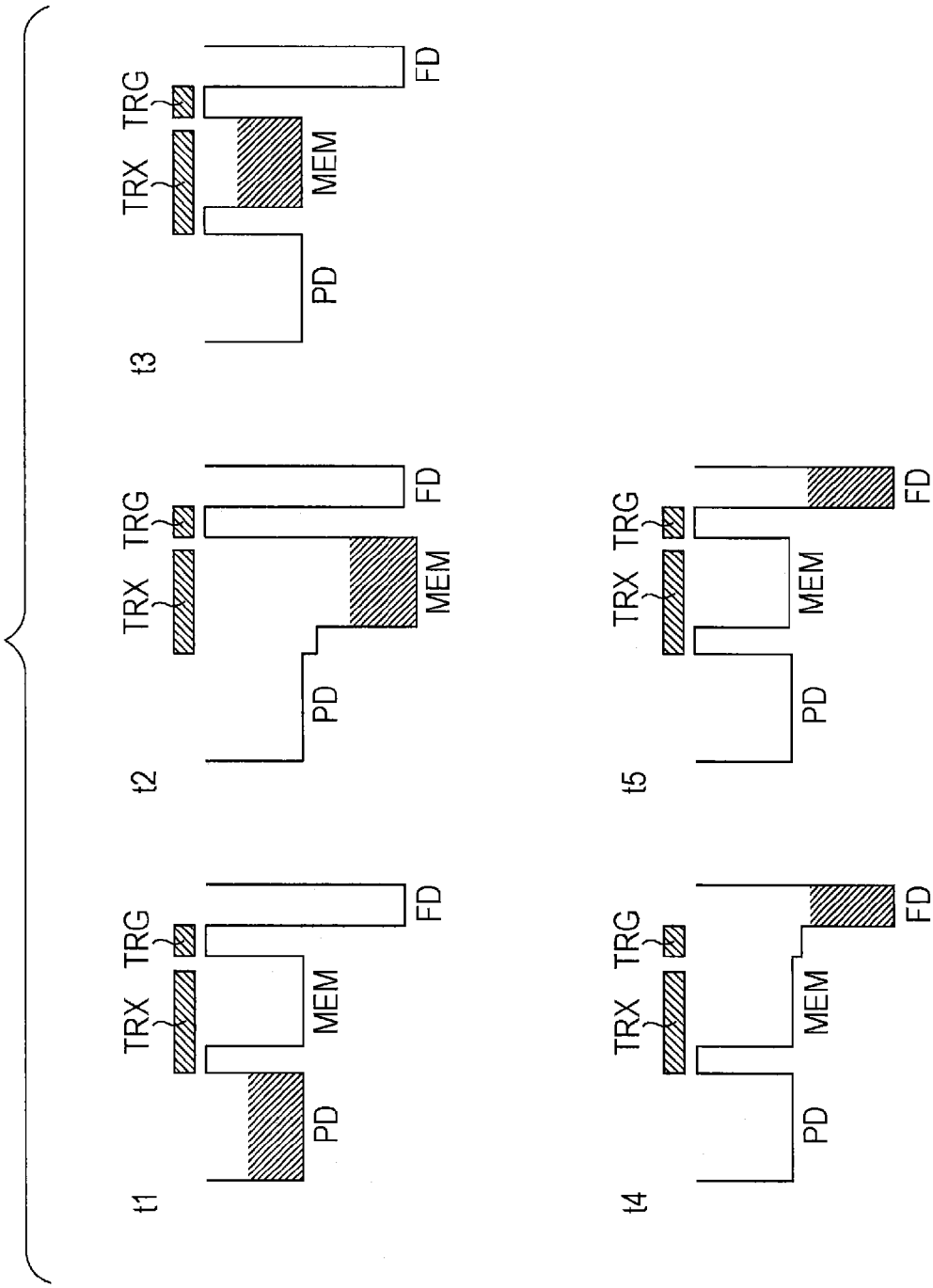
FIG. 3 is a potential diagram describing the driving method of the unit pixel of the related art.
Figure 4:
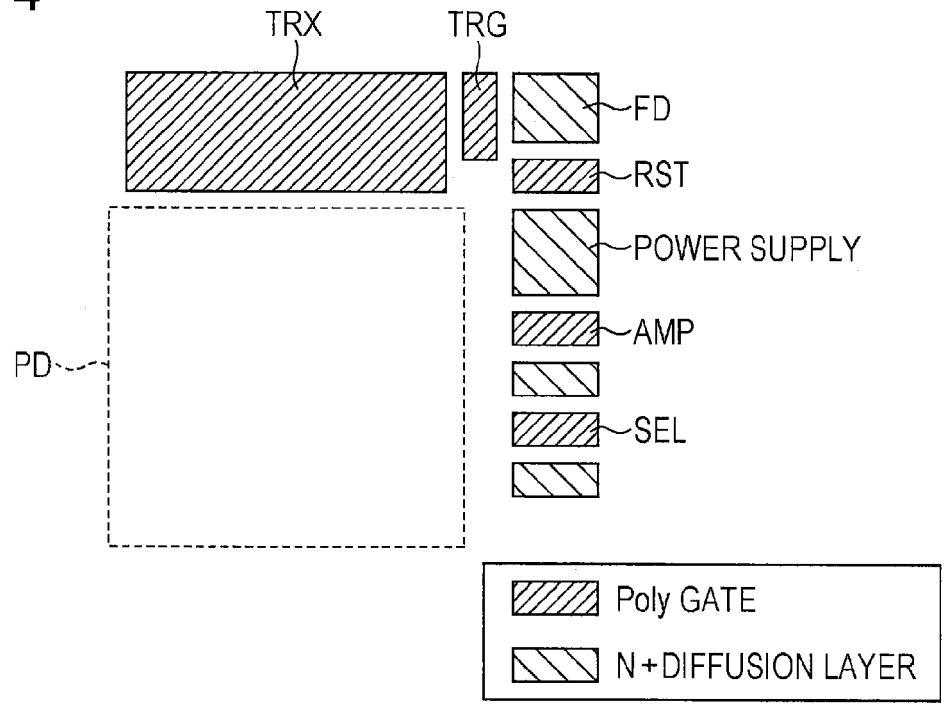
FIG. 4 is a plan view illustrating a configuration of the unit pixel of the related art.
Figure 5:
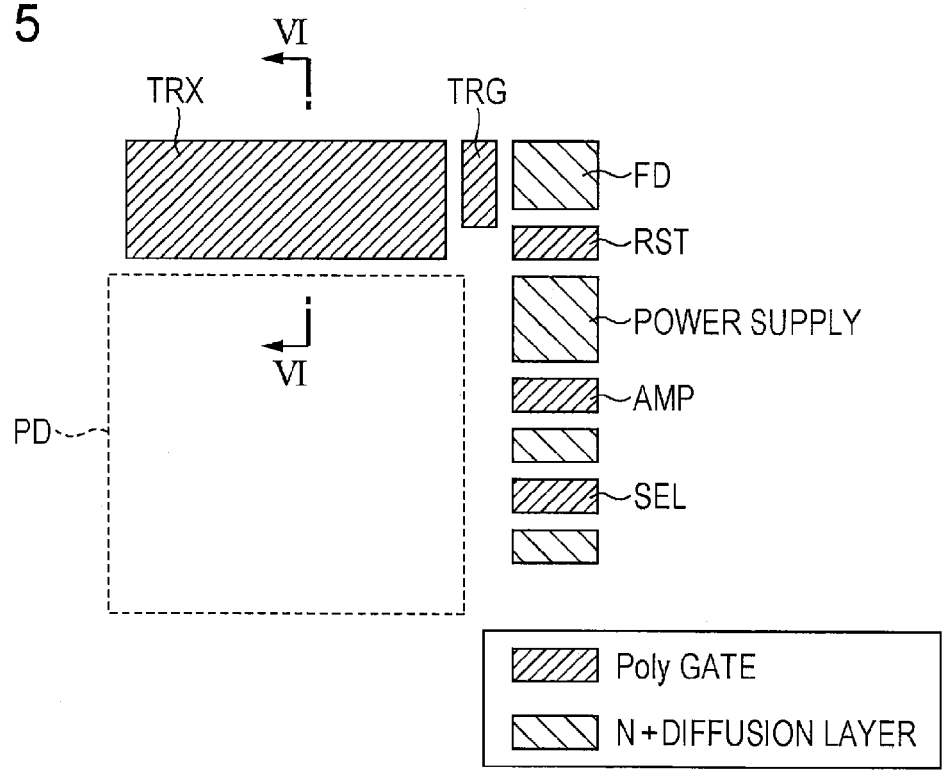
FIG. 5 is a view describing a cross section of VI-VI in a first transfer gate.
Figure 6:
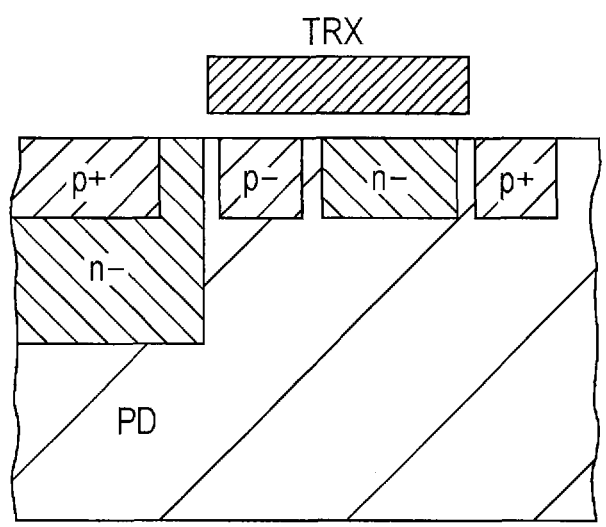
FIG. 6 is a cross-sectional view of a line VI-VI in FIG. 5.
Figure 7:
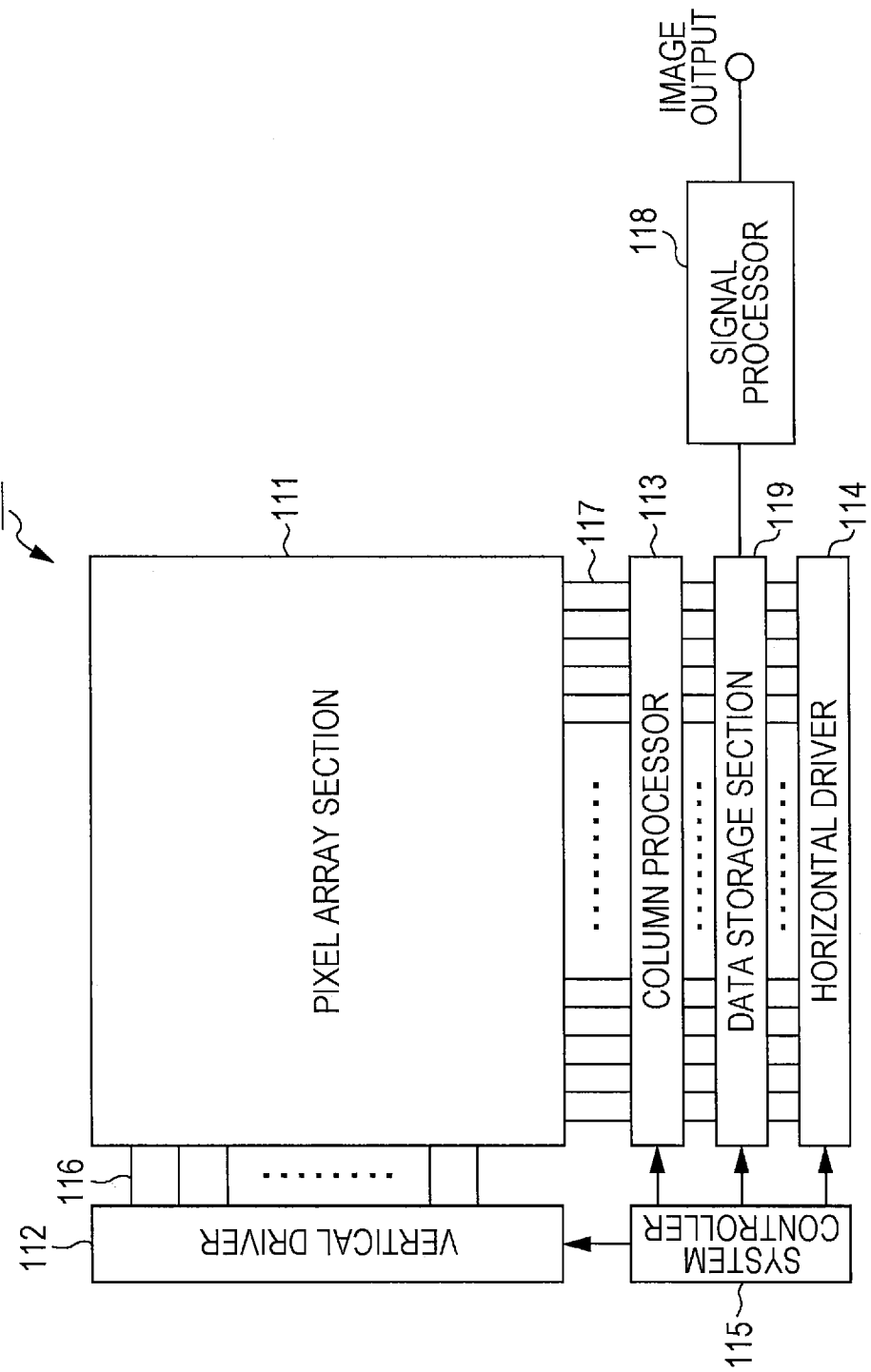
FIG. 7 is a view illustrating an exemplary illustration of a CMOS image sensor to which the present technology is applied.

FIG. 7 is a view illustrating an embodiment of a CMOS image sensor as a solid-state imaging device to which the present technology is applied.

As illustrated in FIG. 7, a CMOS image sensor 100 is configured to have a pixel array section 111 and a peripheral circuit section. The peripheral circuit section is configured of a vertical driver 112, a column processor 113, a horizontal driver 114, and a system controller 115.

The CMOS image sensor 100 further includes a signal processor 118 and a data storage section 119. The signal processor 118 and the data storage section 119 may be installed on the same substrate as the CMOS image sensor 100 and may be subject to processing by an external signal processor, for example, a Digital Signal Processor (DSP) or software, provided on a different substrate from that of the CMOS image sensor 100.

In the pixel array section 111, unit pixels (hereinafter, may be simply referred to as "pixels") having photoelectric conversion elements are two-dimensionally disposed in a matrix shape. Detailed configuration of the unit pixel is described below.

Further, in the pixel array section 111, a pixel driving line 116 is formed along a lateral direction of the view for each row with respect to a pixel array of the matrix shape and a vertical signal line 117 is formed along a vertical direction of the view for each column. One end of the pixel driving line 116 is connected to an output end of the vertical driver 112 corresponding to each row.

The vertical driver 112 is a pixel driving section that is configured of a shift register, an address decoder or the like, and drives each pixel of the pixel array section 111 for all pixels simultaneously or on a row-by-row basis.

A signal output from each unit pixel of pixel row which is selectively scanned by the vertical driver 112 is supplied to the column processor 113 through each vertical signal line 117. The column processor 113 performs a predetermined signal process with respect to a signal output from each unit pixel of a selected row through the vertical signal line 117 for each pixel column of the pixel array section 111 and temporarily holds the pixel signal after the signal is subject to processing.

Particularly, the column processor 113 performs, at least, a noise removal process, for example, performs a Correlated Double Sampling (CDS) process as the signal process. A fixed pattern noise peculiar to the pixel such as a reset noise, a threshold variation of an amplification transistor or the like is removed by the CDS process using the column processor 113. The column processor 113 has, for example, an Analog/Digital (A/D) conversion function in addition to the noise removal process and may output a signal level as a digital signal.

The horizontal driver 114 is configured of a shift register, an address decoder or the like, and sequentially selects a unit circuit corresponding to the pixel column of the column processor 113. The pixel signal that is signal processed in the column processor 113 is output in order by selective scanning using the horizontal driver 114.

The system controller 115 is configured of a timing generator that generates various timing signals or the like and performs driving control of the vertical driver 112, the column processor 113, the horizontal driver 114, the data storage section 119 and the like, based on various timing signals generated in the timing generator.

The signal processor 118 has at least an adding process function and performs various signal processes such as an adding process and the like with respect to the pixel signal output from the column processor 113. The data storage section 119 temporarily stores data necessary for the process when the signal process is performed in the signal processor 118.

Structure of Unit Pixel

Next, a detailed structure of unit pixels 120 disposed in the matrix shape in the pixel array section 111 of FIG. 7 is described with reference to FIG. 8. FIG. 7 is a plan view illustrating a configuration of the unit pixel 120.

The unit pixel 120 has, for example, a photodiode (PD) 121 as the photoelectric conversion element. For example, the photodiode 121 is an embedded type photodiode that is formed by forming a p-type layer 133 on a surface side of the substrate and embedding an n-type embedded layer 134 with respect to a p-type well layer 132 formed on an n-type substrate 131. Moreover, the p-type layer 133 and the n-type embedded layer 134 have impurity concentrations that become in a depletion state when an electric charge is discharged.

The unit pixel 120 has a first transfer gate (TRX1 and TRX2) 122, a memory section (MEM) 123, a second transfer gate (TRG) 124, and a floating diffusion region (FD) 125 in addition to the photodiode 121. Moreover, although not illustrated, the unit pixel 120 is shielded by a light shielding film for shielding portions other than an opening through which light is introduced to the photodiode 121, a contact section of each transistor or the like.

The first transfer gate 122 is configured to include a gate electrode 122A formed of polysilicon. The gate electrode 122A is divided into two electrodes. One gate electrode 122A-1 is formed to cover a region between the photodiode 121 and the memory section 123, and a part of an upper section of the memory section 123. Further, the other gate electrode 122A-2 is formed to cover a part of the upper section of the memory section 123. Contacts for wiring are respectively connected to upper sections of the gate electrodes 122A-1 and 122A-2.

The first transfer gate 122 transfers the electric charge accumulated in the photodiode 121 to the memory section 123 by applying the transfer pulse TRX1 to the gate electrode 122A-1 through a contact and applying the transfer pulse TRX2 to the gate electrode 122A-2.

The memory section 123 is formed by an n-type embedded channel 135 having an impurity concentration that becomes in a depletion state when the electric charge is discharged, which is formed in a lower section of the gate electrodes 122A-1 and 122A-2, and holds the electric charge transferred from the photodiode 121 by the first transfer gate 122.

Further, it is possible to apply modulation to the memory section 123 by disposing the gate electrodes 122A-1 and 122A-2 in the upper section of the memory section 123 and applying the transfer pulses TRX1 and TRX2 to the gate electrodes 122A-1 and 122A-2. That is, the potential of the memory section 123 is deepened by applying the transfer pulses TRX1 and TRX2 to the gate electrodes 122A-1 and 122A-2. Therefore, it is possible to increase a saturated electric charge quantity of the memory section 123 to more than a case where the modulation is not performed.

The second transfer gate 124 is configured to include a gate electrode 124A formed of polysilicon. The gate electrode 124A is formed in an upper section of a boundary portion between the memory section 123 and the floating diffusion region 125. Further, the contact for wiring is connected to an upper section of the gate electrode 124A. The second transfer gate 124 transfers the electric charge held in the memory section 123 to the floating diffusion region 125 by applying a transfer pulse TRG to the gate electrode 124A through the contact.

The floating diffusion region 125 is an electric charge voltage conversion section formed of an n-type layer having an impurity concentration that can electrically connect the contact for wiring and converts the electric charge transferred from the memory section 123 by the second transfer gate 124 into a voltage. The contact for wiring is connected to an upper section of the floating diffusion region 125.

A reset transistor 126 is connected between a power supply Vrst and the floating diffusion region 125, and resets the floating diffusion region 125 by applying a control pulse RST to the gate electrode.

A drain electrode of an amplification transistor 127 is connected to a power supply Vdd and a gate electrode is connected to the floating diffusion region 125. Further, a drain electrode of a selection transistor 128 is connected to the source electrode of the amplification transistor 127 and a source electrode is connected to the vertical signal line 117, respectively.

The selection transistor 128 selects the unit pixel 120 in which the signal is to be read by applying a control pulse SEL to the gate electrode. Then, in a case where the unit pixel 120 that is an object in which the pixel signal is read is selected by the selection transistor 128, the amplification transistor 127 reads and amplifies the pixel signal indicating the voltage of the floating diffusion region 125 and outputs the pixel signal from the source electrode. The selection transistor 128 supplies the pixel signal from the amplification transistor 127 to the column processor 113 through the vertical signal line 117.

Figure 8:
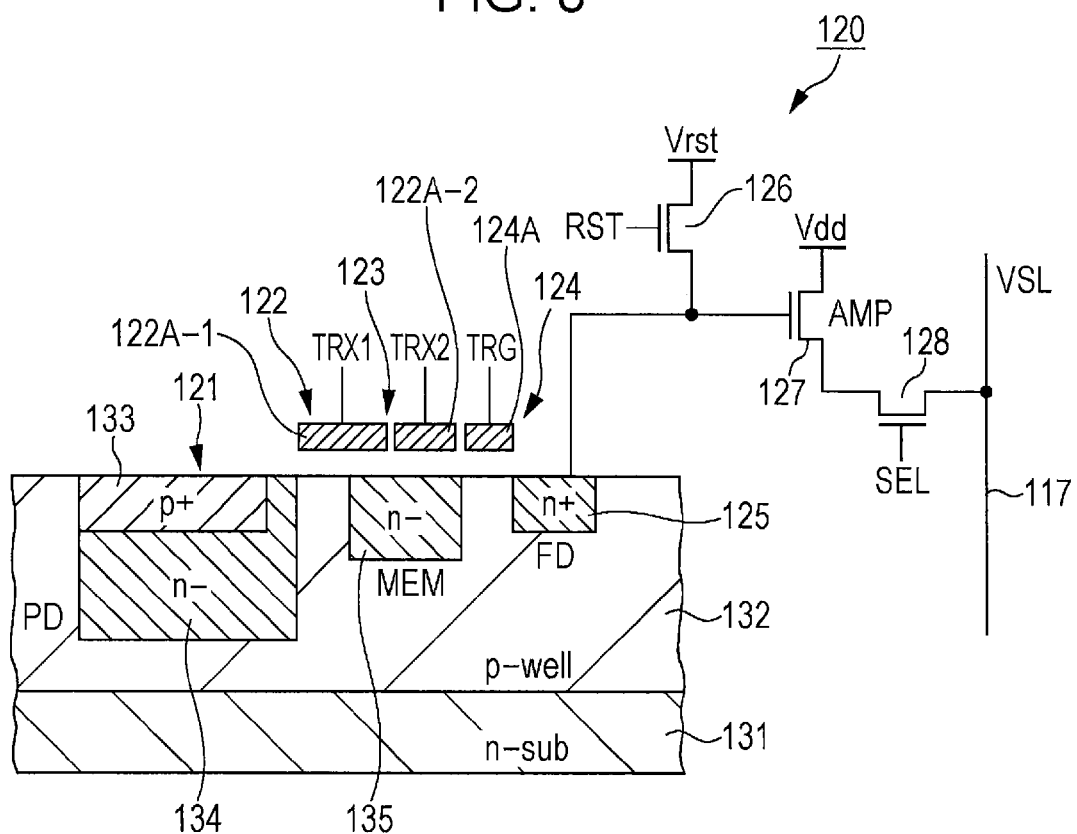
FIG. 8 is a cross-sectional view illustrating an exemplary illustration of a unit pixel to which the present technology is applied.

Moreover, in the unit pixel 120 of FIG. 8, the p-type well layer 132 is provided in the lower section of the gate electrode 122A-1 and the boundary portion between the photodiode 121 and the memory section 123. It is possible to realize both of the transfer from the photodiode 121 to the memory section 123 when a voltage level of the gate electrode 122A-1 is a high level (VH level) and element separation between the photodiode 121 and the memory section 123 when the voltage level is a low level (VL level) by providing a p-impurity diffusion region and adjusting the impurity concentration.

In the CMOS image sensor 100 including the pixel array section 111 in which a plurality of the unit pixels 120 having such a structure are disposed in the matrix shape, a global shutter operation (global exposure) is realized by starting the exposure of all pixels simultaneously and completing the exposure of all pixels simultaneously, and transferring the electric charge accumulated in the photodiode 121 to the memory section 123 that is shielded. It is possible to capture the image by the global shutter operation without distortion in an exposure period in which all pixels match.

Detailed Structure of First Transfer Gate

Next, a detailed structure of the first transfer gate 122 is described with reference to FIGS. 9 to 12.

Figure 9:
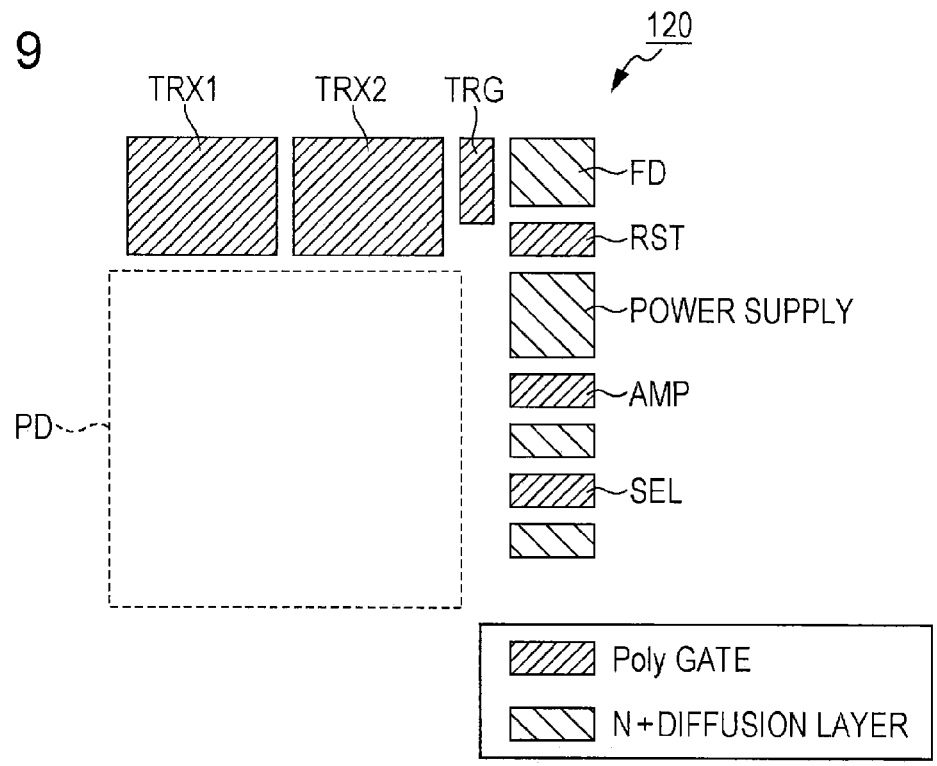
FIG. 9 is a plan view illustrating an exemplary illustration of the unit pixel to which the present technology disclosure is applied.

FIG. 9 is a plan view illustrating a configuration example of the unit pixel 120 of FIG. 8. As illustrated in FIG. 9, in the unit pixel 120, the gate electrode of the first transfer gate 122 is divided into two electrodes of the gate electrode 122A-1 and the gate electrode 122A-2. In the first transfer gate 122, the electric charge accumulated in the photodiode 121 is transferred to the memory section 123 by applying the transfer pulse TRX1 to the gate electrode 122A-1 and applying the transfer pulse TRX2 to the gate electrode 122A-2.

Figure 10:
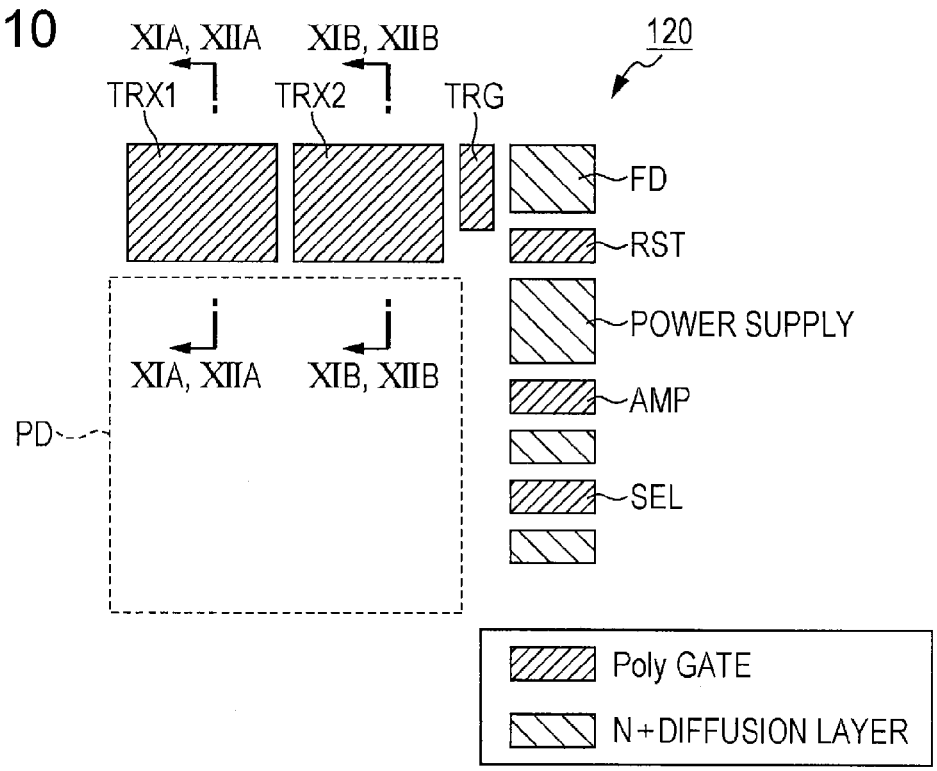
FIG. 10 is a view describing a cross section of XIA-XIA, XIIA-XIIA, XIB-XIB, and XIIB-XIIB in first transfer gates.
Figure 11A:
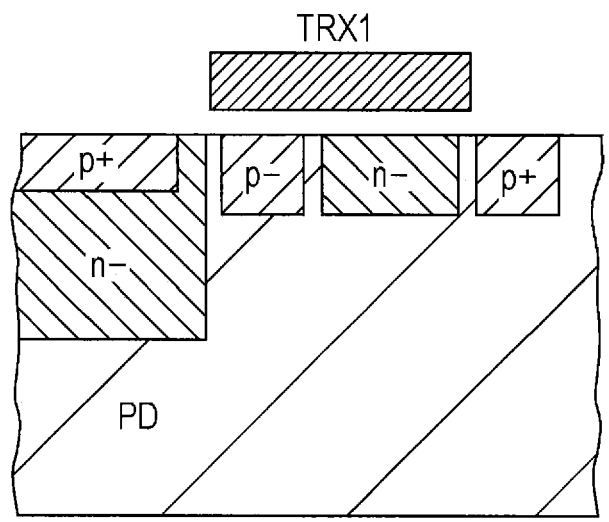
FIGS. 11A and 11B are respectively cross-sectional views in XIA-XIA and XIB-XIB of FIG. 10.
Figure 11B:
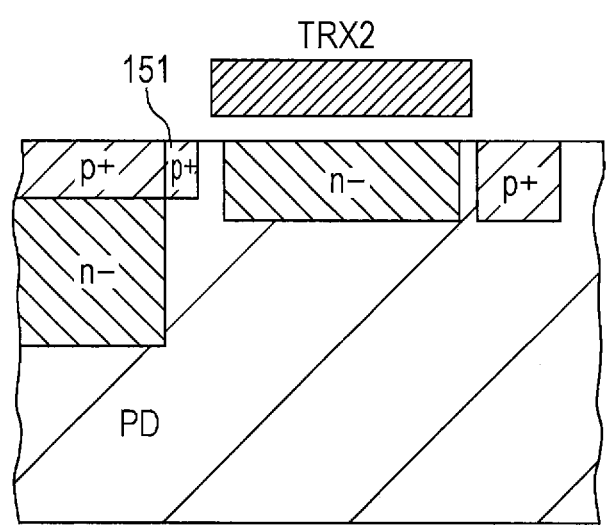

Here, as illustrated in FIG. 10, when illustrating a cross section of XIA-XIA and XIIA-XIIA in the gate electrode 122A-1, and a cross section of XIB-XIB and XIIB-XIIB in the gate electrode 122A-2, FIGS. 11A and 11B are cross-sectional views illustrating the cross sections thereof.

As illustrated in FIG. 11A, in the cross-sectional view of the gate electrode 122A-1, the p-impurity diffusion region is formed to perform the element separation between the photodiode 121 and the memory section 123. It is necessary for the p-impurity diffusion region to realize an electric charge reading function when the voltage level of the transfer pulse TRX1 applied to the gate electrode 122A-1 is the high level (the VH level) and an element separation function between the photodiode 121 and the memory section 123 when the voltage level of the transfer pulse TRX1 is the low level (the VL level). Thus, potential followability to the gate voltage is necessary and as illustrated in FIG. 11A, the p-impurity diffusion region is disposed in the lower section of the gate electrode 122A-1 and is necessarily a region of certain size.

In the unit pixel 120, since it is divided into two electrodes of the gate electrode 122A-1 and the gate electrode 122A-2, it is not necessary to realize the electric charge reading function in the gate electrode 122A-2 by setting the electrode for reading the electric charge to only the gate electrode 122A-1. In this case, as illustrated in FIG. 11B, in the lower section of the gate electrode 122A-2, for example, since a structure in which the p-impurity diffusion region is thinned and the like may be used, it is possible to increase an electric charge quantity that may be held in the memory section 123. Further, if attention is paid to the transfer to the floating diffusion region (FD) 125, since a width in a transfer direction thereof is widened, the transfer is easily performed.

Further, as illustrated in FIG. 11B, in the lower section of the gate electrode 122A-2, it is possible to perform the element separation between the photodiode 121 and the memory section 123 by forming a p+ impurity diffusion region 151.

As described above, in a first region that is used for reading the electric charge accumulated in the photodiode 121, the element separation between the photodiode 121 and the memory section 123 is performed by a gate bias using the gate electrode 122A-1 and, in a second region that is not used for reading the electric charge, the element separation is not performed by an element separation structure different from the first region.

Figure 12A:
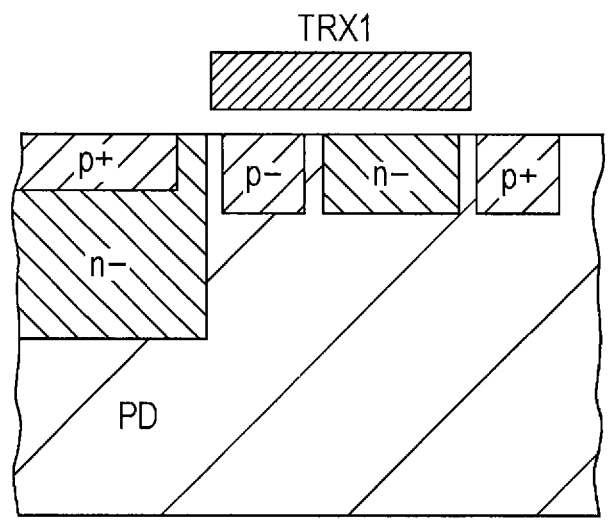
FIGS. 12A and 12B are respectively cross-sectional views in XIIA-XIIA and XIIB-XIIB of FIG. 10.
Figure 12B:
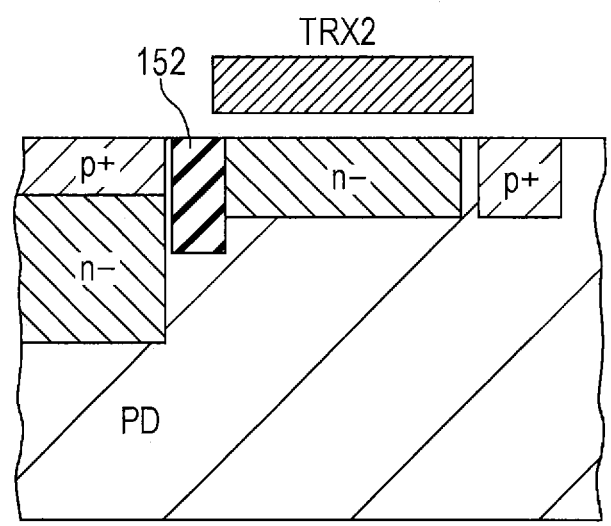

Moreover, FIGS. 12A and 12B illustrate another structure example of the cross section of XIIA-XIIA in the gate electrode 122A-1 illustrated in FIG. 10, and the cross section of XIIB-XIIB in the gate electrode 122A-2. Similar to the cross-sectional view of FIG. 11A, the cross-sectional view of FIG. 12A illustrates a structure of the first region that is used for reading the electric charge. Further, in the cross-sectional view of FIG. 12B, an element separation region is formed by filling an insulating layer such as an oxide film (SiO$_2$) 152 after a shallow recess is formed by a Shallow Trench Isolation (STI) instead of the p+ impurity diffusion region 151 of FIG. 11B. It is possible to perform the element separation between the photodiode 121 and the memory section 123 in the second region that is not used for reading the electric charge by using the element separation structure of FIG. 12B.

Driving Method of Unit Pixel

First Driving Example of Unit Pixel

Figure 13:
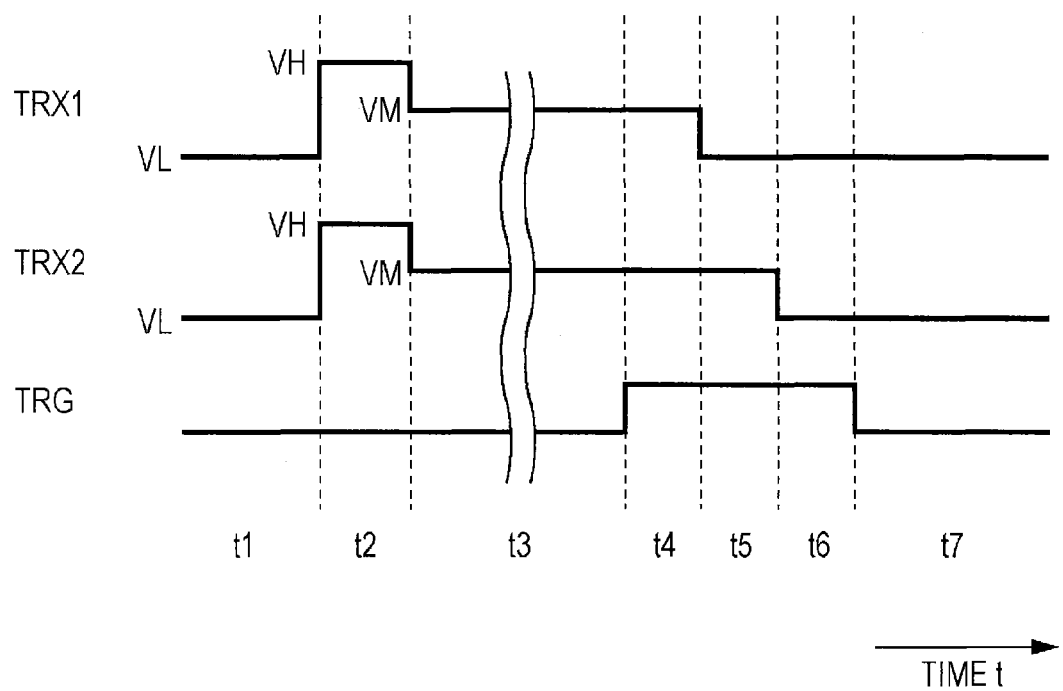
FIG. 13 is a timing chart describing a first driving example of the unit pixel to which the present technology is applied.
Figure 14:
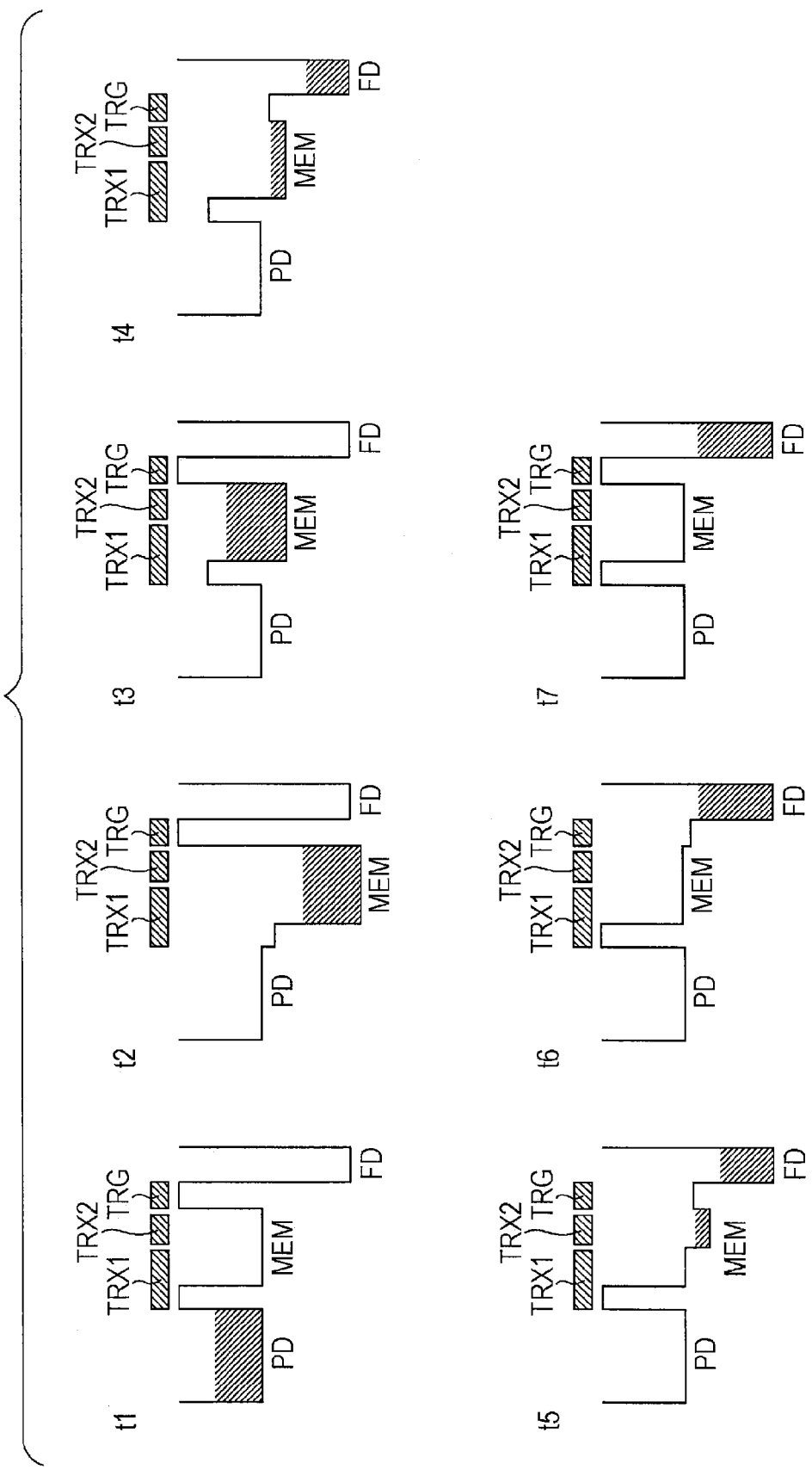
FIG. 14 is a potential diagram describing the first driving example of the unit pixel to which the present technology is applied.

Next, a first driving example of the unit pixel 120 of FIG. 8 is described with reference to FIGS. 13 and 14. However, in a potential diagram of FIG. 14, states of a period t1 to period t7 correspond respectively to a period t1 to a period t7 in a timing chart of FIG. 13. Further, the voltage level of the transfer pulse applied to each gate electrode becomes one of "the VH level" of the high level, "the VL level" of the low level or "a VM level" that becomes a level of an intermediate potential thereof. A relationship of the voltage level is also similar to another timing chart described below.

In the period t1, the electric charge obtained from light from the object is newly accumulated in the photodiode 121 concurrently for all pixels after the electric charge of the photodiode 121 and the memory section 123 is discharged. In the period t2, if the voltage level of the transfer pulses TRX1 and TRX2 applied to the gate electrodes 122A-1 and 122A-2 in the first transfer gate 122 becomes the VH level, the electric charge accumulated in the photodiode 121 is transferred to the memory section 123.

In the period t3, if the voltage level of the transfer pulses TRX1 and TRX2 applied to the gate electrodes 122A-1 and 122A-2 of the first transfer gate 122 becomes the VM level, the electric charge is held in the memory section 123.

Thereafter, in the period t4, if the voltage level of the transfer pulse TRG applied to the gate electrode 124A of the second transfer gate 124 becomes the high level (the VH level or the VM level), a part of the electric charge held in the memory section 123 is transferred to the floating diffusion region 125. Moreover, at this time, a part of the electric charge that is not transferred to the floating diffusion region 125 is held in the memory section 123.

In the period t5, if the voltage level of the transfer pulse TRX1 applied to the gate electrode 122A-1 of the first transfer gate 122 becomes the VL level, in the memory section 123, the electric charge held in the lower section of the gate electrode 122A-1 moves to the lower section of the gate electrode 122A-2. Therefore, the electric charge quantity held in the floating diffusion region 125 increases.

Thereafter, in the period t6, the voltage level of the transfer pulse TRX2 applied to the gate electrode 122A-2 of the first transfer gate 122 becomes the VL level, and all electric charge held in the memory section 123 is transferred to the floating diffusion region 125. Then, in the period t7, if the voltage level of the transfer pulse TRG applied to the gate electrode 124A of the second transfer gate 124 becomes the low level (the VL level), the voltage depending on the electric charge held in the floating diffusion region 125 is read as the signal level.

Hereinbefore, the first driving example is described. In the first driving example, since the gate electrode 122A-1 and the gate electrode 122A-2 are separately driven in the first transfer gate 122, in the period t5, an electric field between the gate electrodes is easily secured and transfer capability is improved. Meanwhile, in the electric charge holding period t3 in which the electric charge is held in the memory section 123, since the same voltage condition is given in the gate electrode 122A-1 and the gate electrode 122A-2, it is possible to prevent a saturated signal quantity from decreasing.

Second Driving Example of Unit Pixel

Next, a second driving example of the unit pixel 120 of FIG. 8 is described with reference to FIGS. 15 and 16. However, in a potential diagram of FIG. 16, states of a period t1 to a period t7 correspond respectively to a period t1 to a period t7 in a timing chart of FIG. 15.

Similar to the first driving example described above, in the period t1 to the period t2, the electric charge accumulated in the photodiode 121 is transferred to the memory section 123. Then, in the period t3, if the voltage level of the transfer pulses TRX1 and TRX2 applied to the gate electrodes 122A-1 and 122A-2 in the first transfer gate 122 becomes the VL level, the electric charge is held in the memory section 123.

Thereafter, in the period t4, if the voltage level of the transfer pulse TRG applied to the gate electrode 124A of the second transfer gate 124 becomes the high level (the VH level or the VM level), the electric charge held in the memory section 123 is transferred to the floating diffusion region 125. Then, the voltage level of the transfer pulse TRX2 applied to the gate electrode 122A-2 of the first transfer gate 122 becomes the VM level from the VL level in the period t5 and then returns to the VL level in the period t6.

Figure 16:
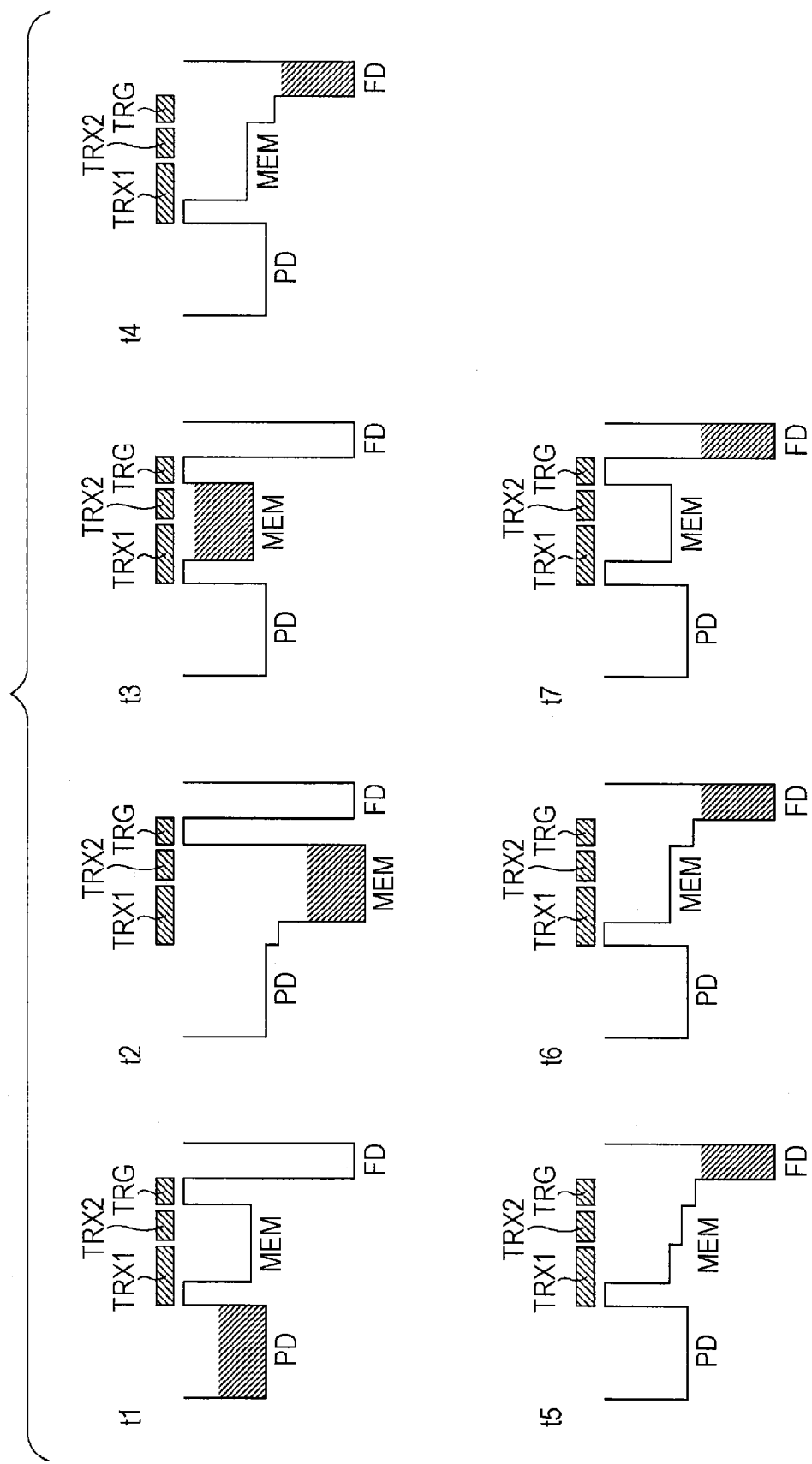
FIG. 16 is a potential diagram describing the second driving example of the unit pixel to which the present technology is applied.

That is, in the potential diagram of FIG. 16, in the period t4 to the period t6, moving of the electric charge is not illustrated, but, for example, in the memory section 123, if an extremely small electric charge remains in the lower section of the gate electrode 122A-1 of the first transfer gate 122, the electric charge moves to the lower section of the gate electrode 122A-2 in the period t5. Therefore, since the electric charge remaining in the memory section 123 is completely transferred to the floating diffusion region 125, it is possible to suppress occurrence of transfer failure.

Thereafter, in the period t7, if the voltage level of the transfer pulse TRG applied to the gate electrode 124A of the second transfer gate 124 becomes the low level (the VL level), the voltage depending on the electric charge held in the floating diffusion region 125 is read as the signal level.

Hereinbefore, the second driving example is described. In the second driving example different from the first driving example described above, in the electric charge holding period t3 in which the electric charge is held in the memory section 123, the voltage level of the transfer pulses TRX1 and TRX2 become the VL level. As the first driving example, if the voltage level of the transfer pulses TRX1 and TRX2 in the electric charge holding period t3 is the VM level, a hole density of an Si interface is lowered and a dark current in an electric charge transfer holding section is increased by increasing the voltage applied to the gate electrode, instead of it being easy to save the number of the saturated electric charge in the electric charge holding period. That is, since a relationship between the saturated signal quantity and the dark current has a trade-off relationship, it may be appropriately determined whether the voltage level of the transfer pulses TRX1 and TRX2 is the VM level or the VL level in the electric charge holding period t3 depending on which one has priority.

Figure 15:
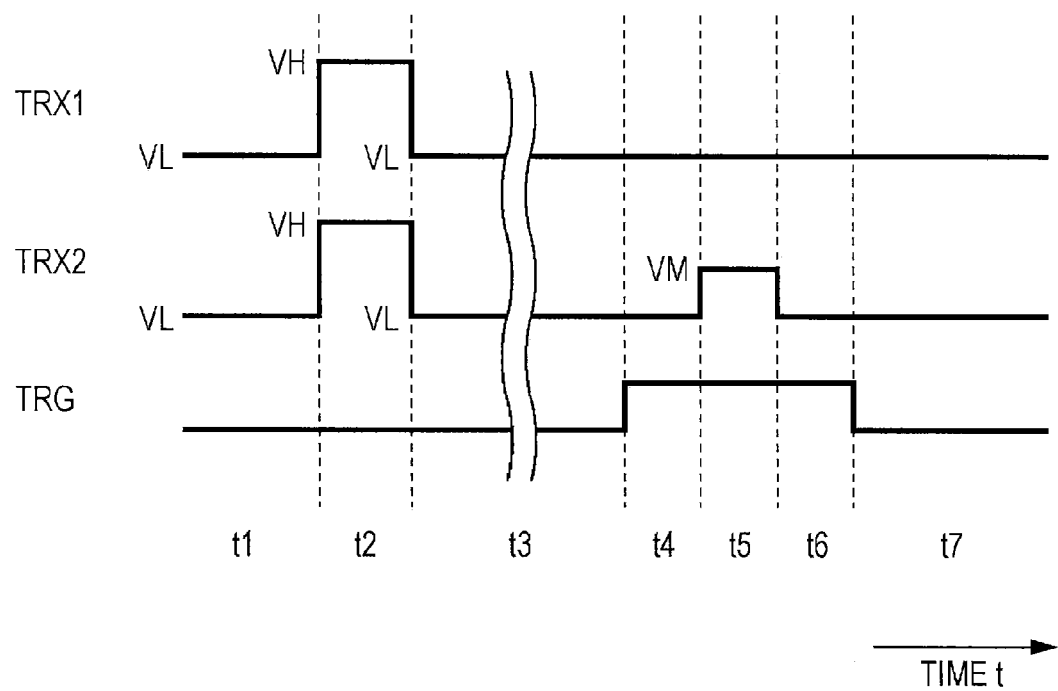
FIG. 15 is a timing chart describing a second driving example of a unit pixel to which the present technology is applied.

Moreover, in the timing chart of FIG. 15, the description is given in which, in the period t4, the voltage level of the transfer pulse TRG applied to the gate electrode 124A of the second transfer gate 124 rises and, thereafter, in the period t5, the voltage level of the transfer pulse TRX2 applied to the gate electrode 122A-2 of the first transfer gate 122 rises, but the voltage levels may rise in the reverse order or may rise at the same time.

Third Driving Example of Unit Pixel

Next, a third driving example of a unit pixel 120 of FIG. 8 is described with reference to FIGS. 17 and 18. However, in the potential diagram of FIG. 18, states of a period t1 to a period t7 correspond respectively to a period t1 to a period t7 in a timing chart of FIG. 17.

In the period t5 in the second driving example described above, the voltage level of the transfer pulse TRX2 applied to the gate electrode 122A-2 of the first transfer gate 122 is the VM level, but in the third driving example, the voltage level is the VH level. Also in this case, for example, in the memory section 123, if an extremely small electric charge remains in the lower section of the gate electrode 122A-1 of the first transfer gate 122, the electric charge moves to the lower section of the gate electrode 122A-2 in the period t5. Therefore, since the electric charge remaining in the memory section 123 is completely transferred to the floating diffusion region 125, it is possible to suppress occurrence of transfer failure.

Moreover, if the gate electrode 122A-2 is used for reading the electric charge, the element separation between the photodiode 121 and the memory section 123 may not be performed in the period t5. However, as illustrated in FIGS. 10 to 12, if the gate electrode 122A-2 is not used for reading the electric charge and the element separation between the photodiode 121 and the memory section 123 is strengthened, as in the third driving example, the voltage level of the transfer pulse TRX2 applied to the gate electrode 122A-2 of the first transfer gate 122 may be the VH level.

Hereinbefore, the third driving example is described. In the third driving example different from the second driving example described above, in the period t5, the voltage level of the transfer pulse TRX2 applied to the gate electrode 122A-2 of the first transfer gate 122 becomes the VH level. Therefore, in the first driving example and the second driving example, three-value driving of the VH level, the VL level and the VM level is used, but since in the third driving example, two-value driving of the VH level (high level) and the VL level (low level) may be used, there is an advantage of being able to reduce a circuit scale.

Figure 17:
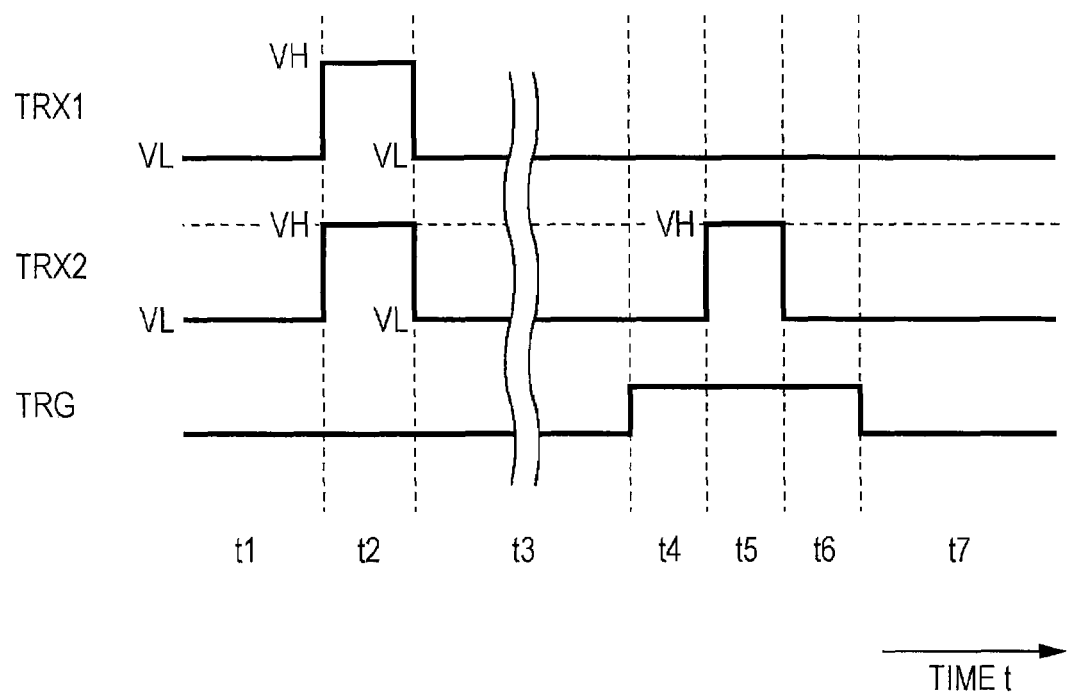
FIG. 17 is a timing chart describing a third driving example of a unit pixel to which the present technology is applied.
Figure 18:
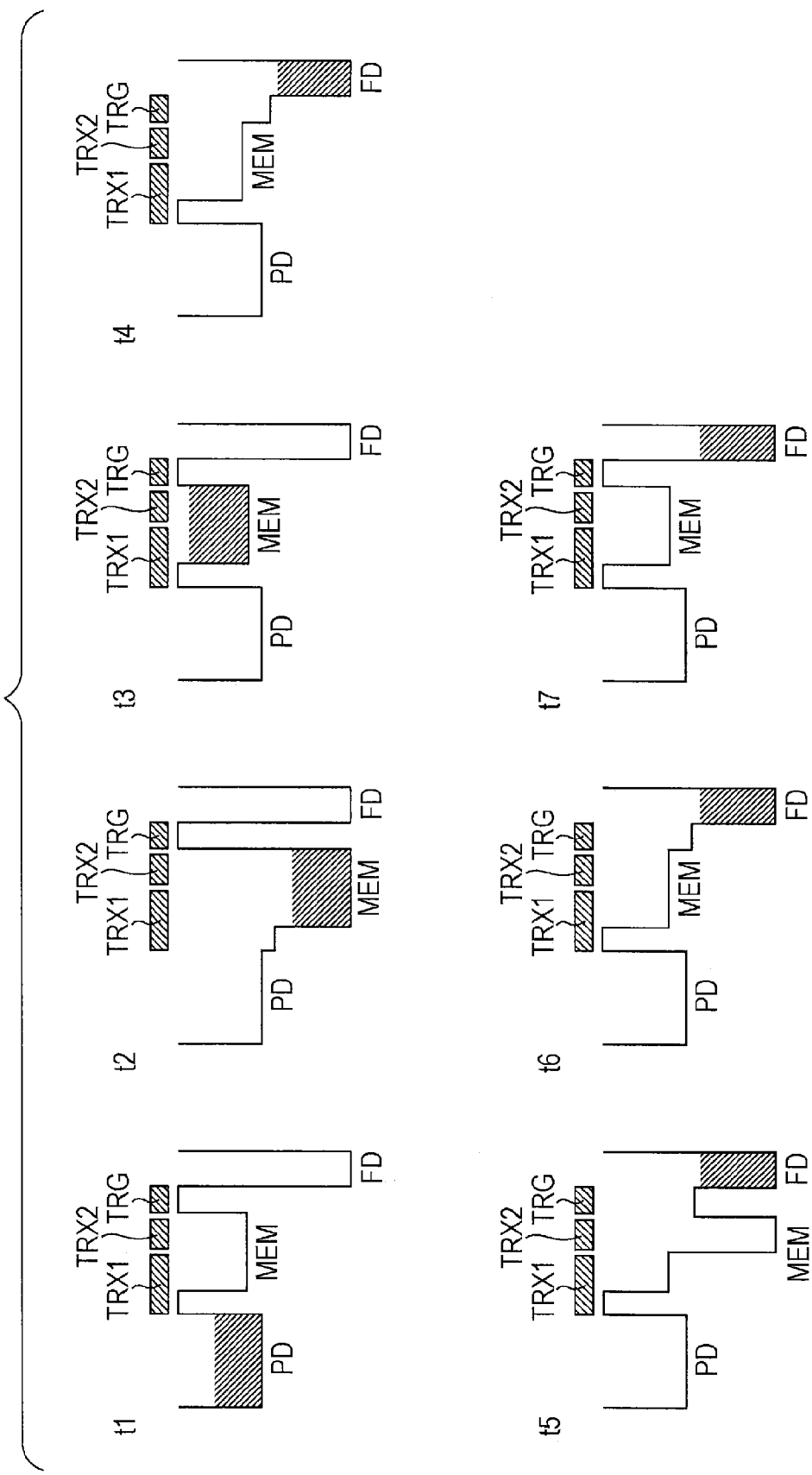
FIG. 18 is a potential diagram describing the third driving example of the unit pixel to which the present technology is applied.

Moreover, in the timing chart of FIG. 17, the description is given in which, in the period t4, the voltage level of the transfer pulse TRG applied to the gate electrode 124A of the second transfer gate 124 rises and, thereafter, in the period t5, the voltage level of the transfer pulse TRX2 applied to the gate electrode 122A-2 of the first transfer gate 122 rises, but the voltage levels may rise in the reverse order or may rise at the same time.

Hereinbefore, according to the first driving example to the third driving example, the memory section 123 holds the electric charge in a two-stage configuration by applying the transfer pulse TRX1 and the transfer pulse TRX2 to the gate electrode 122A-1 and the gate electrode 122A-2 which are divided into two electrodes in the first transfer gate 122, but the element separation region is not provided between regions of the two-stage configuration. That is, since an N-type region is formed between the regions of a two-stage configuration in the memory section 123, it is also possible to hold the electric charge between the regions.

Modification Example

Figure 19:
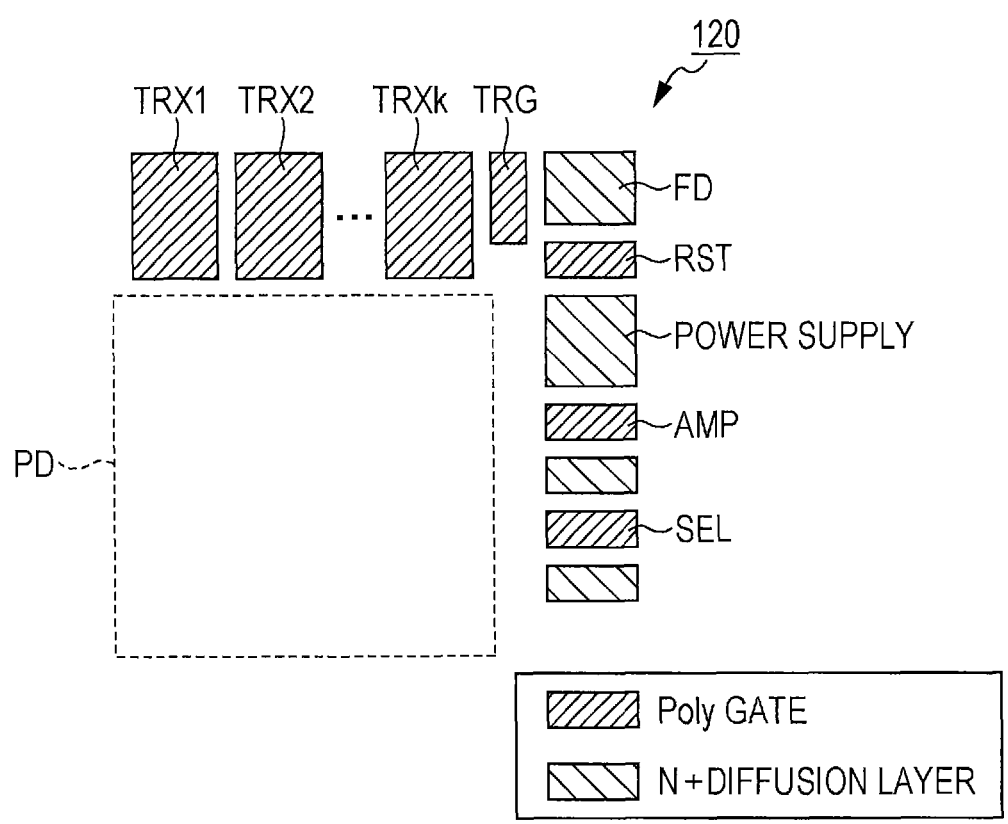
FIG. 19 is a plan view illustrating another configuration example of a unit pixel to which the present technology is applied.

In the above description, an example is described in which the gate electrode 122A in the first transfer gate 122 is divided into two electrodes of the gate electrode 122A-1 and the gate electrode 122A-2, but the number of parts divided into is not limited to two and the number of the division may be any if the number of the parts divided into is two or greater. FIG. 19 illustrates a case where the gate electrode 122A of the first transfer gate 122 is divided into k electrodes (k is an integer of two or greater). As illustrated in FIGS. 11A and 11B, in FIG. 19, each of k gate electrodes has either structure of FIG. 11A or FIG. 11B. Moreover, the structure of FIG. 12B may be used instead of the structure of FIG. 11B.

Modification Example of Configuration of Solid-State Imaging Device

Figure 20:
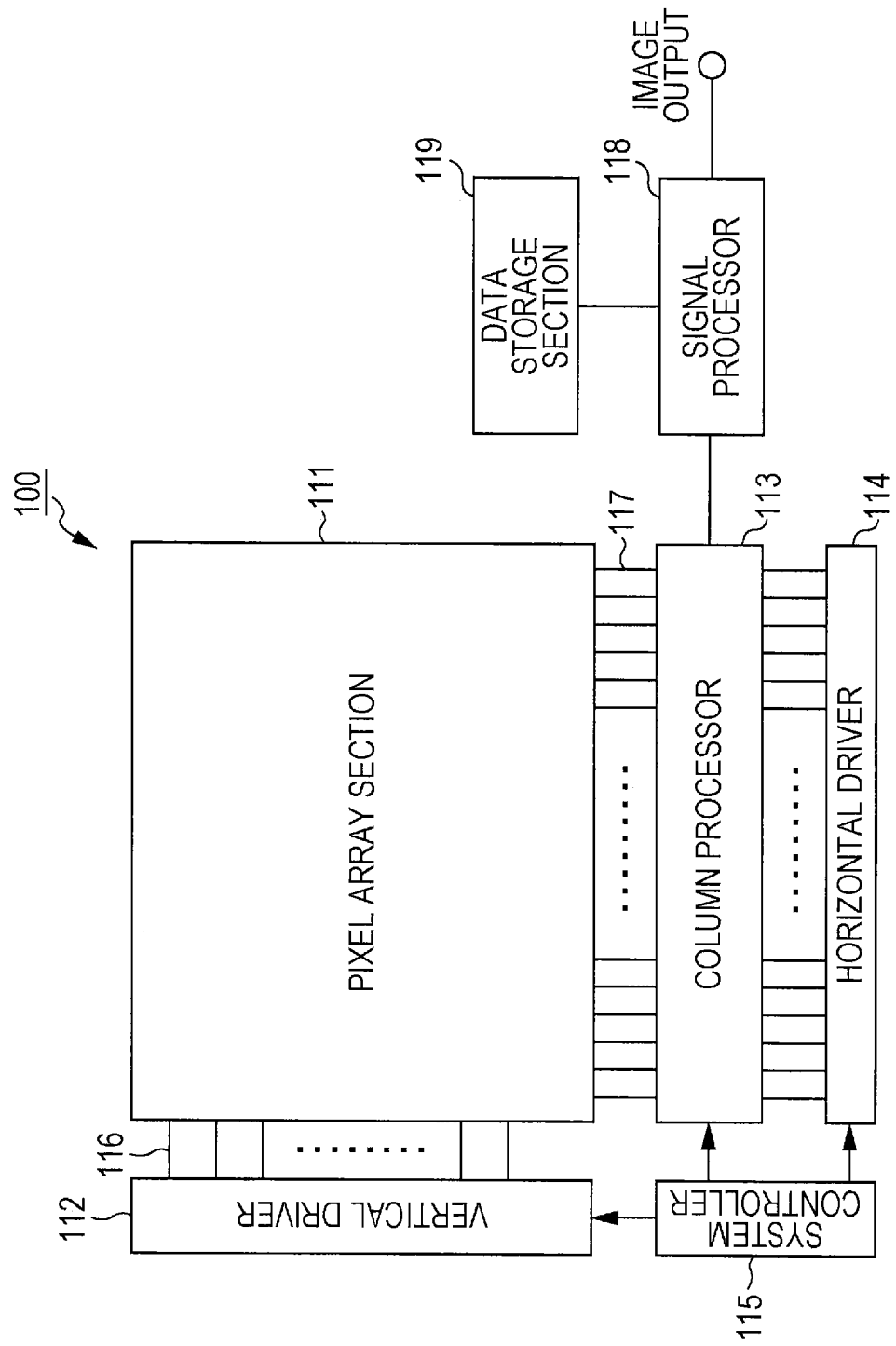
FIG. 20 is a view illustrating another exemplary illustration of a CMOS image sensor to which the present technology is applied.

In the above description, as illustrated in FIG. 7, a configuration is described in which the data storage section 119 is provided in parallel with respect to the signal processor 118 in a rear stage of the column processor 113, but the disclosure is not limited to the configuration. For example, as illustrated in FIG. 20, a configuration may be employed in which the data storage section 119 is provided in parallel with the column processor 113 and the signal process is performed with respect to the data which are read at the same time by horizontal scanning using the horizontal driver 114 in the signal processor 118 of the rear stage.

Figure 21:
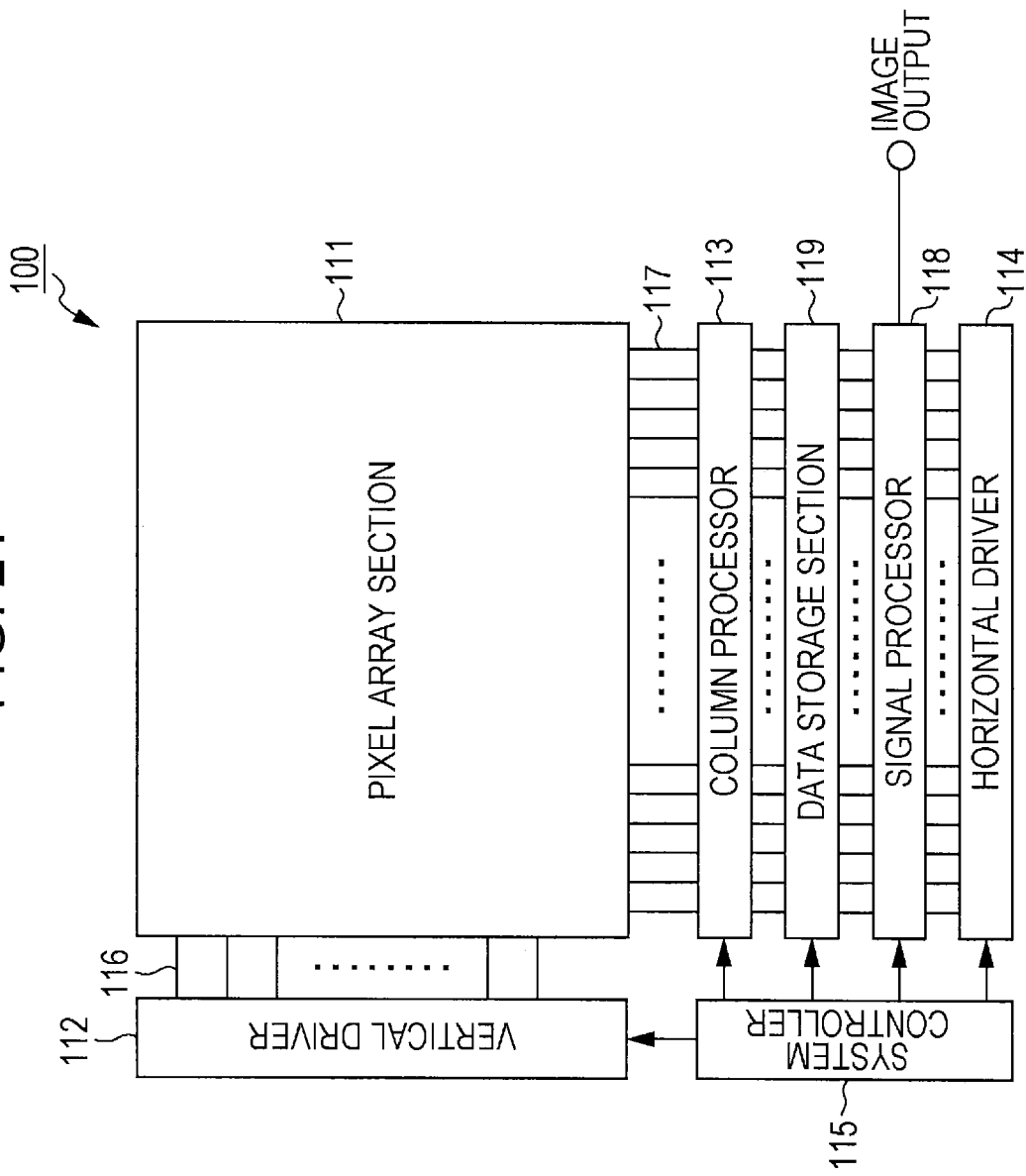
FIG. 21 is a view illustrating still another exemplary illustration of a CMOS image sensor to which the present technology is applied.

Further, as illustrated in FIG. 21, a configuration may be employed in which the column processor 113 has an A/D conversion function performing A/D conversion for each column or a plurality of columns of the pixel array section 111, the data storage section 119 and the signal processor 118 are provided in parallel with respect to the column processor 113, and each process in the data storage section 119 and the signal processor 118 is performed for each column or the plurality of columns, after the noise removal process is performed in analog or digital in the signal processor 118.

Moreover, the present technology is not limited to the application to the solid-state imaging device. That is, the present technology may be applied to an electronic apparatus in general using a solid-state imaging device in an image capturing section (photoelectric convertor) such as an imaging device such as a digital still camera or a digital video camera, a mobile terminal device having an imaging function, and a copy machine using a solid-state imaging device in the image reading unit. The solid-state imaging device may have a form that is formed as one chip or may be a form of a module having the imaging function which is packaged with the imaging section, the signal processor or an optical system.

Figure 22:
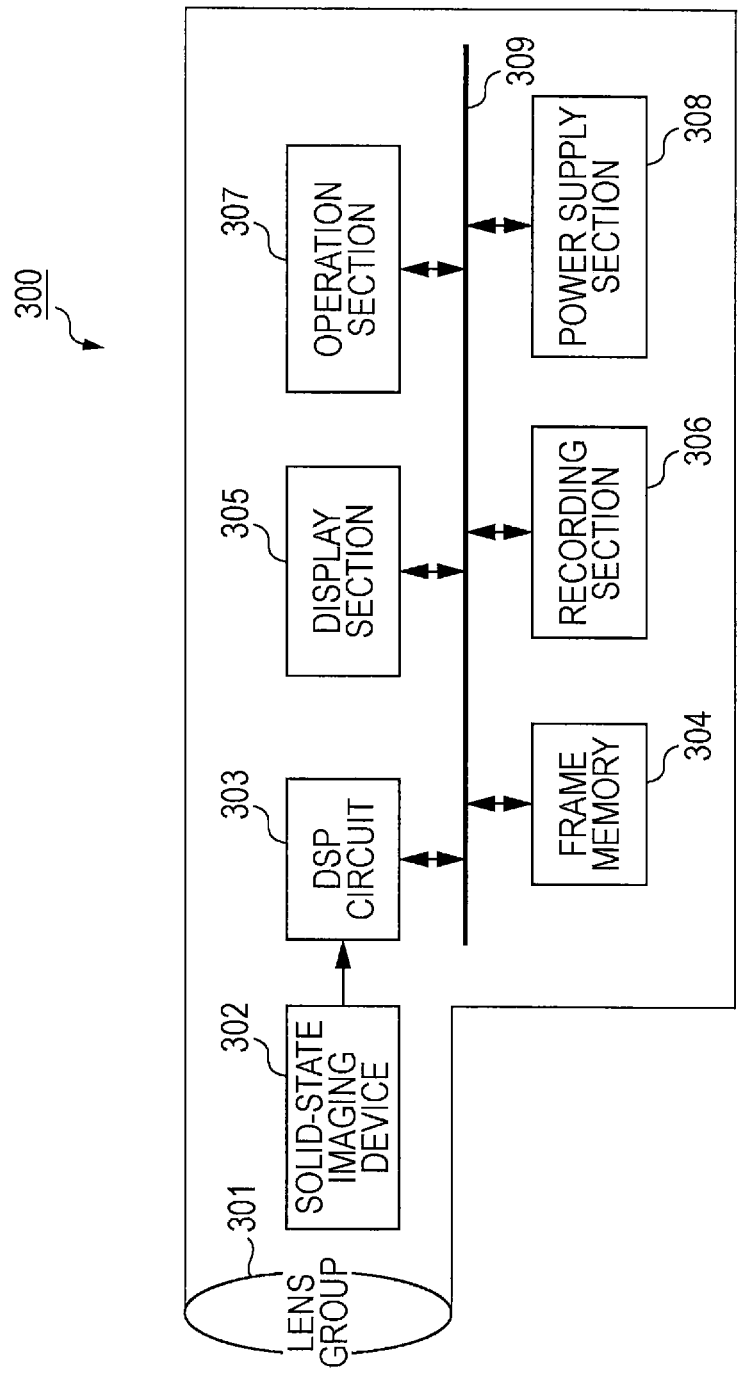
FIG. 22 is a view illustrating an exemplary illustration of an electronic apparatus to which the present technology is applied.

Configuration Example of Electronic Apparatus to which Present Technology is Applied FIG. 22 is a view illustrating an embodiment of an electronic apparatus to which the present technology is applied.

An electronic apparatus 300 illustrated in FIG. 22 includes an optical section 301 formed of a lens group and the like, a solid-state imaging device 302 in which each configuration of the unit pixel 120 described above is employed, and a Digital Signal Processor (DSP) circuit 303 that is a camera signal process circuit. Further, the electronic apparatus 300 includes a frame memory 304, a display section 305, a recording section 306, an operation section 307, and a power supply section 308. The DSP circuit 303, the frame memory 304, the display section 305, the recording section 306, the operation section 307, and the power supply section 308 are connected to each other through a bus line 309.

The optical section 301 forms an image on an imaging surface of the solid-state imaging device 302 by capturing incident light (image light) from an object. The solid-state imaging device 302 converts a quantity of the incident light in which the image is formed on the imaging surface by the optical section 301 into an electric signal in pixel units and then outputs the electric signal as the pixel signal. As the solid-state imaging device 302, it is possible to use a solid-state imaging device such as the CMOS image sensor 100 according to the embodiment described above, that is, a solid-state imaging device that may realize the capture of the image with no distortion by the global exposure.

For example, the display section 305 is formed of a panel type display device such as a liquid crystal panel or an electro-luminescence (EL) panel, and displays a moving image or a still image that is imaged in the solid-state imaging device 302. The recording section 306 records the moving image or the still image that is captured in the solid-state imaging device 302 on a recording medium such as a video tape, a Digital Versatile Disc (DVD) and a flash memory.

The operation section 307 issues operation commands with respect to various functions held in the electronic apparatus 300 under the operation of a user. The power supply section 308 appropriately supplies various powers which are operation powers of the DSP circuit 303, the frame memory 304, the display section 305, the recording section 306, and the operation section 307 to the objects to be supplied.

As the solid-state imaging device 302, since a noise reduction process also including a kTC noise may be performed by using the CMOS image sensor 100 according to the embodiment described above, it is possible to secure a high S/N. Therefore, also in the electronic apparatus 300 such as the digital still camera, the digital video camera, or a camera module for a mobile device such as a mobile phone, it is possible to achieve high image quality in a captured image.

Further, the embodiment described above is described as an example which is applied to the CMOS image sensor that is formed by disposing the unit pixels in the matrix shape detecting the signal electric charge as a physical quantity depending on the light quantity of visible light. However, the present technology is not limited to the application to the CMOS image sensor and may be applied to a column-type solid-state imaging device in general in which a column press section is disposed for each pixel column of the pixel array section.

Moreover, the present technology is not limited to the application to the solid-state imaging device that captures the image by detecting the distribution of the incident quantity of light of visible light and may be applied to a solid-state imaging device that captures distribution of an incident quantity of infrared rays, X-rays, particles and the like as an image, or, in a broader sense, a solid-state imaging device (a physical quantity distribution detection device) such as a fingerprint detection sensor that captures an image by detecting distribution of other physical quantities such as a pressure or an electrostatic capacitance.

Moreover, an embodiment of the present technology is not limited to the embodiment described above and may be variously modified without departing from the scope of the present technology.

Further, the present technology may be configured as described below.

(1) A solid-state imaging device including: a plurality of unit pixels, in which the unit pixel includes a photoelectric conversion element that generates electric charge depending on a light quantity of incident light and accumulates the electric charge on the inside thereof, a first transfer gate that transfers the electric charge accumulated in the photoelectric conversion element, an electric charge holding region that holds the electric charge transferred from the photoelectric conversion element by the first transfer gate, a second transfer gate that transfers the electric charge held in the electric charge holding region, and a floating diffusion region that holds the electric charge transferred from the electric charge holding region by the second transfer gate for reading as a signal, in which the electric charge holding region has regions of a plurality of stages for holding the electric charge, and in which an N-type region is formed between the regions of the plurality of stages.

(2) The solid-state imaging device according to (1), in which the regions of the plurality of stages are formed of one of a first region that is used for reading the electric charge accumulated in the photoelectric conversion element and a second region other than the first region.

(3) The solid-state imaging device according to (2), in which in the first region, element separation between the photoelectric conversion element and the electric charge holding region is performed by a gate bias using the first transfer gate, and in which in the second region, the element separation is performed by an element separation structure different from that of the first region.

(4) The solid-state imaging device according to (3), in which in the second region, the element separation is performed by a p+ impurity diffusion region.

(5) The solid-state imaging device according to (3), in which in the second region, the element separation is performed by an oxide film region.

(6) The solid-state imaging device according to any one of (1) to (5), in which the regions of the plurality of stages have a two-stage configuration.

(7) The solid-state imaging device according to any one of (1) to (6), wherein the first transfer gate is configured of a plurality of electrodes corresponding to the regions of the plurality of stages.

(8) A driving method of a solid-state imaging device including: a plurality of unit pixels; and a driving controller that controls driving of the unit pixels, in which the unit pixel includes a photoelectric conversion element that generates electric charge depending on a light quantity of incident light and accumulates the electric charge on the inside thereof, a first transfer gate that transfers the electric charge accumulated in the photoelectric conversion element, an electric charge holding region that holds the electric charge transferred from the photoelectric conversion element by the first transfer gate, a second transfer gate that transfers the electric charge held in the electric charge holding region, and a floating diffusion region that holds the electric charge transferred from the electric charge holding region by the second transfer gate for reading as a signal, and in which the method includes: controlling driving of the first transfer gate configured of a plurality of electrodes corresponding to the regions of the plurality of stages which hold the electric charge in the electric charge holding region and has a region therebetween that becomes an N-type region by the driving controller for each electrode.

(9) An electronic apparatus that is equipped with a solid-state imaging device, including: a plurality of unit pixels, in which the unit pixel includes a photoelectric conversion element that generates electric charge depending on a light quantity of incident light and accumulates the electric charge on the inside thereof, a first transfer gate that transfers the electric charge accumulated in the photoelectric conversion element, an electric charge holding region that holds the electric charge transferred from the photoelectric conversion element by the first transfer gate, a second transfer gate that transfers the electric charge held in the electric charge holding region, and a floating diffusion region that holds the electric charge transferred from the electric charge holding region by the second transfer gate for reading as a signal, in which the electric charge holding region has the plurality of stages of regions for holding the electric charge, and in which an N-type region is formed between the regions of the plurality of stages.

(10) A solid-state imaging device comprising:
a pixel that includes:
  a photoelectric conversion element that converts incident light into and electric charge,
  a first transfer gate that includes a plurality of electrodes and transfers the electric charge from the photoelectric conversion element,
  a charge holding region that holds the electric charge transferred from the photoelectric conversion element by the first transfer gate, each of the plurality of electrodes of the first transfer gate corresponding to a sub-region of the charge holding region, and
  a second transfer gate that transfers the electric charge from the charge holding region; and
a floating diffusion region that holds the electric charge transferred from the charge holding region by the second transfer gate.

(11) The solid-state imaging device according to (10), wherein the sub-regions of the charge holding region include a first sub-region that reads the electric charge directly from the photoelectric conversion element and a second sub-region different from the first sub-region.

(12) The solid-state imaging device according to any one of (10) through (11), wherein the first sub-region is electrically separated from the photoelectric conversion element by a gate bias of a corresponding electrode of the first transfer gate, and wherein the second sub-region stage is electrically separated from the photoelectric conversion element by an element separation structure different from that of the first sub-region.

(13) The solid-state imaging device according to any one of (10) through (12), wherein the second sub-region is electrically separated from the photoelectric conversion element by a p+ impurity diffusion region.

(14) The solid-state imaging device according to any one of (10) through (12), wherein the second sub-region is electrically separated from the photoelectric conversion element by an oxide film region.

(15) The solid-state imaging device according to cl any one of (10) through (14), wherein the first transfer gate includes two electrodes.

(16) The solid-state imaging device according to any one of (10) through (11), further comprising a control circuit that is configured to cause the pixel to transfer the electric charge from the photoelectric conversion element to the floating diffusion region by, in order:

supplying a high potential to each of the plurality of electrodes of the first transfer gate, thereby transferring the electric charge from the photoelectric conversion element to the charge holding region;

switching the high potential to an intermediate potential in each of the electrodes of the first transfer gate; and opening the second transfer gate and, while the second transfer gate is open, sequentially supplying a low potential to the plurality of electrodes of the first transfer gate, thereby transferring the electric charge from the charge holding region to the floating diffusion region, wherein the intermediate potential has a value between the respective values of the high and low potentials.

(17) The solid-state imaging device according to any one of (10) through (16), wherein at least one of the sub-regions of the charge holding region is electrically separated from the photoelectric conversion element when the intermediate or low potentials are supplied to the corresponding electrode of the first transfer gate, and is electrically connected to the photoelectric conversion element when the high potential is supplied to the corresponding electrode of the first transfer gate.

(18) The solid-state imaging device according to any one of (10) through (17), further comprising a control circuit that is configured to cause the pixel to transfer the electric charge from the photoelectric conversion element to the floating diffusion region by, in order:

supplying an ON potential to at least one of the plurality of electrodes of the first transfer gate, thereby transferring the electric charge from the photoelectric conversion element to the charge holding region;

supplying an OFF potential to each of the plurality of electrodes of the first transfer gate, the OFF potential being a potential that prevents charge from flowing from the photoelectric conversion element to the charge holding region; and opening the second transfer gate and, while the second transfer gate is open, supplying one of the ON potential and an intermediate potential to a given electrode of the plurality of electrodes of the first transfer gate, and then supplying the OFF potential to the given electrode, thereby transferring the electric charge from the charge holding region to the floating diffusion region, wherein the intermediate potential has a value between the respective values of the ON and OFF potentials.

(19) A method of driving a solid-state imaging device that includes a photoelectric conversion element that converts incident light into and electric charge, a first transfer gate that includes a plurality of electrodes and transfers electric charge from the photoelectric conversion element, a charge holding region that holds the electric charge transferred from the photoelectric conversion element by the first transfer gate and that includes a plurality of sub-regions each corresponding to one of the electrodes of the first transfer gate, a second transfer gate that transfers the electric charge from the charge holding region, and a floating diffusion region that holds the electric charge transferred from the charge holding region by the second transfer gate, the method including:

transferring charge from the photoelectric conversion element to the charge holding region by applying signal pulses to the electrodes of the first transfer gate;

transferring charge from the charge holding region to the floating diffusion by applying signal pulses to at least one of the electrodes of the first transfer gate and to the second transfer gate.

(20) The method of (19), further comprising:

causing the pixel to transfer the electric charge from the photoelectric conversion element to the floating diffusion region by, in order:

supplying a high potential to each of the plurality of electrodes of the first transfer gate, thereby transferring the electric charge from the photoelectric conversion element to the charge holding region;

switching the high potential to an intermediate potential in each of the electrodes of the first transfer gate;

opening the second transfer gate and, while the second transfer gate is open, sequentially supplying a low potential to the plurality of electrodes of the first transfer gate, thereby transferring the electric charge from the charge holding region to the floating diffusion region.

(21) An electronic apparatus that is equipped with a solid-state imaging device comprising a pixel that includes:

a photoelectric conversion element that converts incident light into electric charge a first transfer gate that includes a plurality of electrodes and transfers the electric charge from the photoelectric conversion element, a charge holding region that holds the electric charge transferred from the photoelectric conversion element by the first transfer gate and that includes a plurality of sub-regions each corresponding to one of the electrodes of the first transfer gate, and a second transfer gate that transfers the electric charge from the charge holding region; and a floating diffusion region that holds the electric charge transferred from the charge holding region by the second transfer gate.

(22) The electronic apparatus according to (21), wherein the sub-regions of the charge holding region include a first sub-region that reads the electric charge directly from the photoelectric conversion element and a second sub-region different from the first sub-region.

(23) The electronic apparatus according to any one of (21) through (22), wherein the first sub-region is electrically separated from the photoelectric conversion element by a gate bias of a corresponding electrode of the first transfer gate, and wherein the second sub-region stage is electrically separated from the photoelectric conversion element by an element separation structure different from that of the first sub-region.

(24) The electronic apparatus according to any one of (21) through (23), wherein the second sub-region is electrically separated from the photoelectric conversion element by a p+ impurity diffusion region.

(25) The electronic apparatus according to any one of (21) through (23), wherein the second sub-region is electrically separated from the photoelectric conversion element by an oxide film region.

(26) The electronic apparatus according to any one of (21) through (25), wherein the first transfer gate includes two electrodes.

(27) The electronic apparatus according to any one of (21) through (26), further comprising a control circuit that is configured to cause the pixel to transfer the electric charge from the photoelectric conversion element to the floating diffusion region by, in order:
supplying a high potential to each of the plurality of electrodes of the first transfer gate, thereby transferring the electric charge from the photoelectric conversion element to the charge holding region;
switching the high potential to an intermediate potential in each of the electrodes of the first transfer gate; and
opening the second transfer gate and, while the second transfer gate is open, sequentially supplying a low potential to the plurality of electrodes of the first transfer gate, thereby transferring the electric charge from the charge holding region to the floating diffusion region,
wherein the intermediate potential has a value between the respective values of the high and low potentials.

(28) The electronic apparatus according to any one of (21) through (27), wherein at least one of the sub-regions of the charge holding region is electrically separated from the photoelectric conversion element when the intermediate or low potentials are supplied to the corresponding electrode of the first transfer gate, and is electrically connected to the photoelectric conversion element when the high potential is supplied to the corresponding electrode of the first transfer gate.

(29) The electronic apparatus according to any one of (21) through (28), further comprising a control circuit that is configured to cause the pixel to transfer the electric charge from the photoelectric conversion element to the floating diffusion region by, in order:
supplying an ON potential to at least one of the plurality of electrodes of the first transfer gate, thereby transferring the electric charge from the photoelectric conversion element to the charge holding region;
supplying an OFF potential to each of the plurality of electrodes of the first transfer gate, the OFF potential being a potential that prevents charge from flowing from the photoelectric conversion element to the charge holding region; and
opening the second transfer gate and, while the second transfer gate is open, supplying one of the ON potential and an intermediate potential to a given electrode of the plurality of electrodes of the first transfer gate, and then supplying the OFF potential to the given electrode, thereby transferring the electric charge from the charge holding region to the floating diffusion region,
wherein the intermediate potential has a value between the respective values of the ON and OFF potentials.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a pixel that includes:
a photoelectric conversion element that converts incident light into an electric charge,
a first transfer gate that includes a plurality of electrodes and transfers the electric charge from the photoelectric conversion element,
a charge holding region that holds the electric charge transferred from the photoelectric conversion element by the first transfer gate, each of the plurality of electrodes of the first transfer gate corresponding to a sub-region of the charge holding region, and
a second transfer gate that transfers the electric charge from the charge holding region;
a floating diffusion region that holds the electric charge transferred from the charge holding region by the second transfer gate; and
a control circuit that is configured to cause the pixel to transfer the electric charge from the photoelectric conversion element to the floating diffusion region by, in order:
supplying a high potential to each of the plurality of electrodes of the first transfer gate, thereby transferring the electric charge from the photoelectric conversion element to the charge holding region;
switching the high potential to an intermediate potential in each of the electrodes of the first transfer gate; and
opening the second transfer gate and, while the second transfer gate is open, sequentially supplying a low potential to the plurality of electrodes of the first transfer gate, thereby transferring the electric charge from the charge holding region to the floating diffusion region,
wherein the intermediate potential has a value between the respective values of the high and low potentials.

2. The solid-state imaging device according to claim 1, wherein the sub-regions of the charge holding region include a first sub-region that reads the electric charge directly from the photoelectric conversion element and a second sub-region different from the first sub-region.

3. The solid-state imaging device according to claim 2, wherein the first sub-region is electrically separated from the photoelectric conversion element by a gate bias of a corresponding electrode of the first transfer gate, and wherein the second sub-region stage is electrically separated from the photoelectric conversion element by an element separation structure different from that of the first sub-region.

4. The solid-state imaging device according to claim 3, wherein the second sub-region is electrically separated from the photoelectric conversion element by a p+ impurity diffusion region.

5. The solid-state imaging device according to claim 3, wherein the second sub-region is electrically separated from the photoelectric conversion element by an oxide film region.

6. The solid-state imaging device according to claim 1, wherein the first transfer gate includes two electrodes.

7. The solid-state imaging device according to claim 1, wherein at least one of the sub-regions of the charge holding region is electrically separated from the photoelectric conversion element when the intermediate or low potentials are supplied to the corresponding electrode of the first transfer gate, and is electrically connected to the photoelectric conversion element when the high potential is supplied to the corresponding electrode of the first transfer gate.

8. A solid-state imaging device comprising:
a pixel that includes:
   a photoelectric conversion element that converts incident light into an electric charge,
   a first transfer gate that includes a plurality of electrodes and transfers the electric charge from the photoelectric conversion element,
   a charge holding region that holds the electric charge transferred from the photoelectric conversion element by the first transfer gate, each of the plurality of electrodes of the first transfer gate corresponding to a sub-region of the charge holding region, and
   a second transfer gate that transfers the electric charge from the charge holding region;
a floating diffusion region that holds the electric charge transferred from the charge holding region by the second transfer gate; and
a control circuit that is configured to cause the pixel to transfer the electric charge from the photoelectric conversion element to the floating diffusion region by, in order:
   supplying an ON potential to at least one of the plurality of electrodes of the first transfer gate, thereby transferring the electric charge from the photoelectric conversion element to the charge holding region;
   supplying an OFF potential to each of the plurality of electrodes of the first transfer gate, the OFF potential being a potential that prevents charge from flowing from the photoelectric conversion element to the charge holding region; and
   opening the second transfer gate and, while the second transfer gate is open, supplying one of the ON potential and an intermediate potential to a given electrode of the plurality of electrodes of the first transfer gate, and then supplying the OFF potential to the given electrode, thereby transferring the electric charge from the charge holding region to the floating diffusion region,
wherein the intermediate potential has a value between the respective values of the ON and OFF potentials.

9. A method of driving a solid-state imaging device comprising a pixel that includes a photoelectric conversion element that converts incident light into an electric charge, a first transfer gate that includes a plurality of electrodes and transfers electric charge from the photoelectric conversion element, a charge holding region that holds the electric charge transferred from the photoelectric conversion element by the first transfer gate and that includes a plurality of sub-regions each corresponding to one of the electrodes of the first transfer gate, a second transfer gate that transfers the electric charge from the charge holding region, and comprising a floating diffusion region that holds the electric charge transferred from the charge holding region by the second transfer gate, the method comprising:
   transferring charge from the photoelectric conversion element to the charge holding region by applying signal pulses to the electrodes of the first transfer gate;
   transferring charge from the charge holding region to the floating diffusion by applying signal pulses to at least one of the electrodes of the first transfer gate and to the second transfer gate; and
   causing the pixel to transfer the electric charge from the photoelectric conversion element to the floating diffusion region by, in order:
   supplying a high potential to each of the plurality of electrodes of the first transfer gate, thereby transferring the electric charge from the photoelectric conversion element to the charge holding region;
   switching the high potential to an intermediate potential in each of the electrodes of the first transfer gate; and
   opening the second transfer gate and, while the second transfer gate is open, sequentially supplying a low potential to the plurality of electrodes of the first transfer gate, thereby transferring the electric charge from the charge holding region to the floating diffusion region.

10. An electronic apparatus comprising:
a solid-state imaging device comprising:
a pixel that includes:
   a photoelectric conversion element that converts incident light into an electric charge,
   a first transfer gate that includes a plurality of electrodes and transfers the electric charge from the photoelectric conversion element,
   a charge holding region that holds the electric charge transferred from the photoelectric conversion element by the first transfer gate and that includes a plurality of sub-regions each corresponding to one of the electrodes of the first transfer gate, and
   a second transfer gate that transfers the electric charge from the charge holding region;
a floating diffusion region that holds the electric charge transferred from the charge holding region by the second transfer gate; and
a control circuit that is configured to cause the pixel to transfer the electric charge from the photoelectric conversion element to the floating diffusion region by, in order:
   supplying a high potential to each of the plurality of electrodes of the first transfer gate, thereby transferring the electric charge from the photoelectric conversion element to the charge holding region;
   switching the high potential to an intermediate potential in each of the electrodes of the first transfer gate; and
   opening the second transfer gate and, while the second transfer gate is open, sequentially supplying a low potential to the plurality of electrodes of the first transfer gate, thereby transferring the electric charge from the charge holding region to the floating diffusion region,
wherein the intermediate potential has a value between the respective values of the high and low potentials.

11. The electronic apparatus according to claim 10, wherein the sub-regions of the charge holding region include a first sub-region that reads the electric charge directly from the photoelectric conversion element and a second sub-region different from the first sub-region.

12. The electronic apparatus according to claim 11, wherein the first sub-region is electrically separated from the photoelectric conversion element by a gate bias of a corresponding electrode of the first transfer gate, and wherein the second sub-region stage is electrically separated from the photoelectric conversion element by an element separation structure different from that of the first sub-region.

13. The electronic apparatus according to claim 12, wherein the second sub-region is electrically separated from the photoelectric conversion element by a p+ impurity diffusion region.

14. The electronic apparatus according to claim 12, wherein the second sub-region is electrically separated from the photoelectric conversion element by an oxide film region.

15. The electronic apparatus according to claim 10, wherein the first transfer gate includes two electrodes.

16. The electronic apparatus according to claim 10, wherein at least one of the sub-regions of the charge holding region is electrically separated from the photoelectric conversion element when the intermediate or low potentials are supplied to the corresponding electrode of the first transfer gate, and is electrically connected to the photoelectric conversion element when the high potential is supplied to the corresponding electrode of the first transfer gate.

17. An electronic apparatus comprising:
a solid-state imaging device comprising:
a pixel that includes:
  a photoelectric conversion element that converts incident light into an electric charge,
  a first transfer gate that includes a plurality of electrodes and transfers the electric charge from the photoelectric conversion element,
  a charge holding region that holds the electric charge transferred from the photoelectric conversion element by the first transfer gate and that includes a plurality of sub-regions each corresponding to one of the electrodes of the first transfer gate, and
  a second transfer gate that transfers the electric charge from the charge holding region;
a floating diffusion region that holds the electric charge transferred from the charge holding region by the second transfer gate; and
a control circuit that is configured to cause the pixel to transfer the electric charge from the photoelectric conversion element to the floating diffusion region by, in order:
  supplying an ON potential to at least one of the plurality of electrodes of the first transfer gate, thereby transferring the electric charge from the photoelectric conversion element to the charge holding region;
  supplying an OFF potential to each of the plurality of electrodes of the first transfer gate, the OFF potential being a potential that prevents charge from flowing from the photoelectric conversion element to the charge holding region; and
  opening the second transfer gate and, while the second transfer gate is open, supplying one of the ON potential and an intermediate potential to a given electrode of the plurality of electrodes of the first transfer gate, and then supplying the OFF potential to the given electrode, thereby transferring the electric charge from the charge holding region to the floating diffusion region,
wherein the intermediate potential has a value between the respective values of the ON and OFF potentials.

* * * * *